(12) United States Patent
Ramesh

(10) Patent No.: US 11,016,765 B2
(45) Date of Patent: May 25, 2021

(54) BIT STRING OPERATIONS USING A COMPUTING TILE

(71) Applicant: Micron Technology, Inc., Boise, ID (US)

(72) Inventor: Vijay S. Ramesh, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/397,148

(22) Filed: Apr. 29, 2019

(65) Prior Publication Data

US 2020/0341762 A1    Oct. 29, 2020

(51) Int. Cl.
   *G06F 9/30*    (2018.01)
   *H03M 7/24*    (2006.01)
   *G06F 9/54*    (2006.01)

(52) U.S. Cl.
   CPC ...... *G06F 9/30018* (2013.01); *G06F 9/30014* (2013.01); *G06F 9/30025* (2013.01); *G06F 9/546* (2013.01); *H03M 7/24* (2013.01)

(58) Field of Classification Search
   CPC .................................................. G06F 9/30018
   See application file for complete search history.

(56) References Cited

U.S. PATENT DOCUMENTS

| | | |
|---|---|---|
| 4,758,972 A | 7/1988 | Frazier |
| 4,928,223 A * | 5/1990 | Dao ........................ G06F 7/483 |
| | | 712/247 |
| 7,865,541 B1 | 1/2011 | Langhammer |
| 8,214,417 B2 | 7/2012 | Ahmed |
| 8,438,455 B2 | 5/2013 | Vogan et al. |
| 9,449,035 B2 | 9/2016 | Grossman et al. |
| 9,477,295 B2 | 10/2016 | Jreji et al. |
| 9,484,103 B1 | 11/2016 | Bruce et al. |
| 2008/0189512 A1* | 8/2008 | Hansen ............... G06F 9/30007 |
| | | 712/1 |

(Continued)

OTHER PUBLICATIONS

A. Podobas and S. Matsuoka, "Hardware Implementation of POSITs and Their Application in FPGAs," 2018 IEEE International Parallel and Distributed Processing Symposium Workshops (IPDPSW), Vancouver, BC, 2018, pp. 138-145, doi: 10.1109/IPDPSW.2018. 00029. (Year: 2018).*

(Continued)

*Primary Examiner* — Michael J Metzger
(74) *Attorney, Agent, or Firm* — Brooks, Cameron & Huebsch, PLLC

(57) ABSTRACT

Systems, apparatuses, and methods related to bit string operations using a computing tile are described. An example apparatus includes a computing device (or "tile") including a processing unit and a memory resource configured as a cache for the processing unit. The computing device can include circuitry to receive a command to initiate an operation to convert data comprising a bit string having a first format that supports arithmetic operations to a first level of precision to a bit string having a second format that supports arithmetic operations to a second level of precision. The computing device can receive, by the memory resource, the bit string based, at least in part, on receipt of the command and, responsive to receipt of the data, perform the operation on the bit string to convert the data from the first format to the second format.

20 Claims, 10 Drawing Sheets

(56) References Cited

U.S. PATENT DOCUMENTS

| | | | |
|---|---|---|---|
| 2009/0150654 A1* | 6/2009 | Oberman | G06F 9/30112 |
| | | | 712/221 |
| 2010/0017649 A1 | 1/2010 | Wu et al. | |
| 2011/0004644 A1* | 1/2011 | Henry | G06F 9/30025 |
| | | | 708/231 |
| 2012/0124115 A1* | 5/2012 | Ollmann | G06F 7/483 |
| | | | 708/204 |
| 2014/0172936 A1* | 6/2014 | Tomono | G06F 9/30014 |
| | | | 708/505 |
| 2015/0371684 A1 | 12/2015 | Mataya | |
| 2019/0042244 A1* | 2/2019 | Henry | G06F 7/5324 |

OTHER PUBLICATIONS

Gustafson, et al., "Beating Floating Point as its Own Game: Posit Arithmetic", Research Paper, retrieved from <http://www.johngustafson.net/pdfs/BeatingFloatingPoint.pdf>, Jan. 2017, 16 pages.

* cited by examiner

BIT STRING OPERATIONS USING A COMPUTING TILE

TECHNICAL FIELD

The present disclosure relates generally to semiconductor memory and methods, and more particularly, to apparatuses, systems, and methods for bit string operations using a computing tile.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

DETAILED DESCRIPTION

Figure 1:
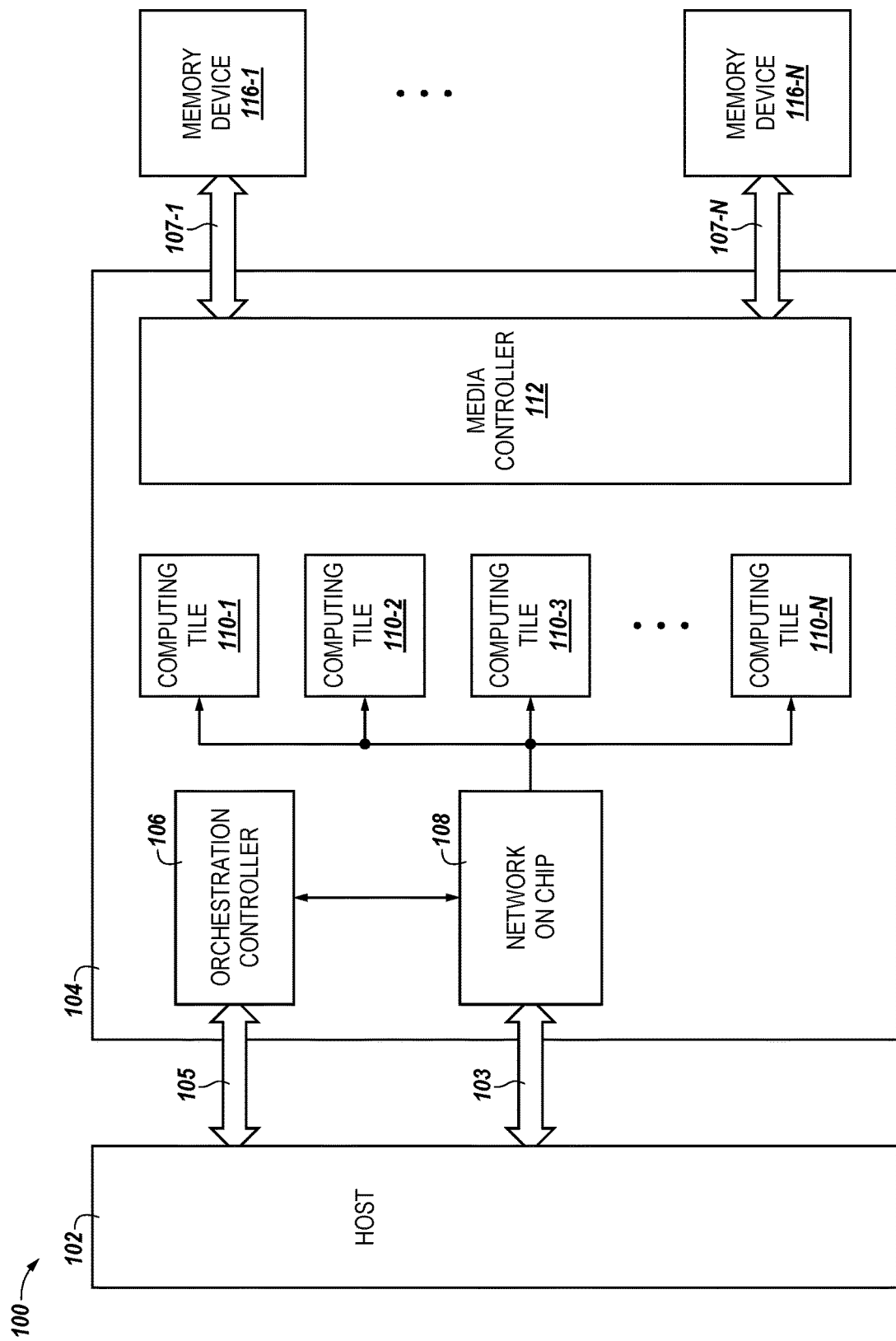
FIG. 1 is a functional block diagram in the form of a computing system including an apparatus including a storage controller and a number of memory devices in accordance with a number of embodiments of the present disclosure.

Systems, apparatuses, and methods related to bit string operations using a computing tile are described. An example apparatus includes a computing device (or "tile") including a processing unit and a memory resource configured as a cache for the processing unit. The computing device can include circuitry to receive a command to initiate an operation to convert data comprising a bit string having a first format that supports arithmetic operations to a first level of precision to a bit string having a second format that supports arithmetic operations to a second level of precision. The computing device can receive, by the memory resource, the bit string based, at least in part, on receipt of the command and, responsive to receipt of the data, perform the operation on the bit string to convert the data from the first format to the second format.

Computing systems may perform a wide range of operations that can include various calculations, which can require differing degrees of accuracy. However, computing systems have a finite amount of memory in which to store operands on which calculations are to be performed. In order to facilitate performance of operation on operands stored by a computing system within the constraints imposed by finite memory resources, in some approaches operands are stored in particular formats. One such format is referred to as the "floating-point" format, or "float," for simplicity (e.g., the IEEE 754 floating-point format).

Under the floating-point standard, bit strings (e.g., strings of bits that can represent a number), such as binary number strings, are represented in terms of three sets of integers or sets of bits—a set of bits referred to as a "base," a set of bits referred to as an "exponent," and a set of bits referred to as a "mantissa" (or significand). The sets of integers or bits that define the format in which a binary number string is stored may be referred to herein as an "numeric format," or "format," for simplicity. For example, the three sets of integers of bits described above (e.g., the base, exponent, and mantissa) that define a floating-point bit string may be referred to as a format (e.g., a first format). As described in more detail below, a posit bit string may include four sets of integers or sets of bits (e.g., a sign, a regime, an exponent, and a mantissa), which may also be referred to as a "numeric format," or "format," (e.g., a second format). In addition, under the floating-point standard, two infinities (e.g., +∞ and −∞) and/or two kinds of "NaN" (not-a-number): a quiet NaN and a signaling NaN, may be included in a bit string.

The floating-point standard has been used in computing systems for a number of years and defines arithmetic formats, interchange formats, rounding rules, operations, and exception handling for computation carried out by many computing systems. Arithmetic formats can include binary and/or decimal floating-point data, which can include finite numbers, infinities, and/or special NaN values. Interchange formats can include encodings (e.g., bit strings) that may be used to exchange floating-point data. Rounding rules can include a set of properties that may be satisfied when rounding numbers during arithmetic operations and/or conversion operations. Floating-point operations can include arithmetic operations and/or other computational operations such as trigonometric functions. Exception handling can include indications of exceptional conditions, such as division by zero, overflows, etc.

An alternative format to floating-point is referred to as a "universal number" (unum) format. There are several forms of unum formats—Type I unums, Type II unums, and Type III unums, which can be referred to as "posits" and/or "valids." Type I unums are a superset of the IEEE 754 standard floating-point format that use a "ubit" at the end of the fraction to indicate whether a real number is an exact float, or if it lies in the interval between adjacent floats. The sign, exponent, and fraction bits in a Type I unum take their definition from the IEEE 754 floating-point format, however, the length of the exponent and fraction fields of Type I unums can vary dramatically, from a single bit to a maximum user-definable length. By taking the sign, exponent, and fraction bits from the IEEE 754 standard floating-point format, Type I unums can behave similar to floating-point numbers, however, the variable bit length exhibited in the exponent and fraction bits of the Type I unum can require additional management in comparison to floats.

Type II unums are generally incompatible with floats, which permits a clean, mathematical design based on projected real numbers. A Type II unum can include n bits and can be described in terms of a "u-lattice" in which quadrants of a circular projection are populated with an ordered set of $2^{n-3}-1$ real numbers. The values of the Type II unum can be reflected about an axis bisecting the circular projection such that positive values lie in an upper right quadrant of the circular projection, while their negative counterparts lie in an upper left quadrant of the circular projection. The lower half of the circular projection representing a Type II unum can include reciprocals of the values that lie in the upper half of the circular projection. Type II unums generally rely on a look-up table for most operations. For example, the size of the look-up table can limit the efficacy of Type II unums in some circumstances. However, Type II unums can provide improved computational functionality in comparison with floats under some conditions.

The Type III unum format is referred to herein as a "posit format" or, for simplicity, a "posit." In contrast to floating-point bit strings, posits can, under certain conditions, allow for a higher precision (e.g., a broader dynamic range and/or a higher accuracy) than floating-point numbers with the same bit width. This can allow for operations performed by a computing system to be performed at a higher rate (e.g., faster) when using posits than with floating-point numbers, which, in turn, can improve the performance of the computing system by, for example, reducing a number of clock cycles used in performing operations, thereby reducing processing time and/or power consumed in performing such operations. In addition, the use of posits in computing systems can allow for higher accuracy and/or precision than floating-point numbers, which can further improve the functioning of a computing system in comparison to some approaches (e.g., approaches which rely upon floating-point format bit strings). Further, because posits can allow for a higher precision than a floating-point number with the same bit width, posits may require less storage space than floating-point numbers.

Posits can be highly variable in precision and accuracy based on the total quantity of bits and/or the quantity of sets of integers or sets of bits included in the posit. In addition, posits can generate a wide dynamic range. The accuracy, precision, and/or the dynamic range of a posit can be greater than that of a float, or other numerical formats, under certain conditions, as described in more detail herein. The variable accuracy, precision, and/or dynamic range of a posit can be manipulated, for example, based on an application in which a posit will be used. In addition, posits can reduce or eliminate the overflow, underflow, NaN, and/or other corner cases that are associated with floats and other numerical formats. Further, the use of posits can allow for a numerical value (e.g., a number) to be represented using fewer bits in comparison to floats or other numerical formats.

These features can, in some embodiments, allow for posits to be highly reconfigurable, which can provide improved application performance in comparison to approaches that rely on floats or other numerical formats. In addition, these features of posits can provide improved performance in machine learning applications in comparison to floats or other numerical formats. For example, posits can be used in machine learning applications in which computational performance is paramount, to train a network (e.g., a neural network) with a same or greater accuracy and/or precision than floats or other numerical formats using fewer bits than floats or other numerical formats. In addition, inference operations in machine learning contexts can be achieved using posits with fewer bits than floats or other numerical formats. By using fewer bits to achieve a same or enhanced outcome in comparison to floats or other numerical formats, the use of posits can therefore reduce the amount of memory space required in such applications, which can improve the overall function of a computing system in which posits are employed.

Embodiments herein are directed to hardware circuitry (e.g., computing tiles or computing devices that can include one or more processing units and/or memory resources) configured to perform various operations on bit strings to improve the overall functioning of a computing device. For example, embodiments herein are directed to hardware circuitry that is configured to perform conversion operations to convert a format of a bit string from a first format (e.g., a floating-point format) to a second format (e.g., a unum format, a posit format, etc.). Once the bit string(s) have been converted to the second format, the circuitry can be operated to perform operations (e.g., arithmetic operations, logical operations, bit-wise operation, vector operations, etc.) on the converted bit strings and/or cause the converted bit strings to be transferred to other circuitry to perform such operations.

In some embodiments, the hardware circuitry can be further operated to convert the results of the operations back to the first format (e.g., to a floating-point format), which can, in turn, be transferred to different circuitry (e.g., a host, a memory device, etc.) of the computing system. By performing the operations in such a manner, the hardware circuitry can facilitate improved performance of the computing system by allowing for improved accuracy and/or precision in the performed operations, improved speed in performing the operations, and/or a reduced required storage space for bit strings prior to, during, or subsequent to, performance of arithmetic and/or logical operations.

In various embodiments described herein, the hardware circuitry (e.g., a computing tile or computing device) that can be operated to perform operations to convert bit strings from one format to another format, and vice versa, and/or cause arithmetic operations and/or logical operations to be performed on the converted bit strings can be resident on a storage controller. As used herein, the term "resident on" refers to something that is physically located on a particular component. For example, the hardware circuitry (e.g., computing tiles) being "resident on" the storage controller refers to a condition in which the hardware circuitry that comprises the computing tiles is physically located on the storage controller. The term "resident on" may be used interchangeably with other terms such as "deployed on" or "located on," herein.

By performing operations to convert bit strings from one format to another format, and vice versa, and/or performing arithmetic operations using hardware circuitry, such as a plurality of computing devices deployed in a storage controller, improved performance of the above-described operations can be realized in comparison to approaches in which such operations are performed using circuitry that is not deployed in a storage controller and/or in comparison to approaches that rely on a single processing unit. For example, in approaches in which operations to convert bit strings from one format to another format, and vice versa, are performed using a different circuit architecture (e.g., a single processing unit architecture, etc.), a greater number of clock cycles and/or a greater amount of time may be required to perform such operations due to the tendency for processing capability on, for example, a memory device to be diminished in comparison to the processing capacity of the computing tiles described herein.

Further, embodiments herein may allow for improved processing performance of machine learning applications, graphics processing applications, high performance computing applications, etc. For example, by utilizing the computing tile architecture described herein, multiple computing tiles may each be able to perform operations on bit strings with bit widths ranging from 8-bits to upward of 64-bits, which can be useful in machine learning applications, graphics processing applications, high performance computing applications, etc. where parallel processing of multiple bit strings may improve computing performance.

For example, as described herein, the computing tiles can provide parallel performance of operations, which can further decrease an amount of time or processing resources required to perform such operations in comparison to some approaches. In some embodiments, multiple computing tiles can each perform operations and/or sub-operations (e.g., constituent portions of an operation that, when combined, represent performance of the operation) on bit strings concurrently (or near-concurrently), which can allow for a decrease in the amount of time to perform such operations in comparison to some approaches.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "A," "B," "C," "D," "E," "N," "M," etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a," "an," and "the" can include both singular and plural referents, unless the context clearly dictates otherwise. In addition, "a number of," "at least one," and "one or more" (e.g., a number of memory banks) can refer to one or more memory banks, whereas a "plurality of" is intended to refer to more than one of such things.

Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically or for access to and movement (transmission) of commands and/or data, as appropriate to the context. The terms "bit strings," "data," and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 110 may reference element "10" in FIG. 1, and a similar element may be referenced as 210 in FIG. 2. A group or plurality of similar elements or components may generally be referred to herein with a single element number. For example, a plurality of reference elements 210-1, 210-2, . . . , 210-N may be referred to generally as 210. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 is a functional block diagram in the form of a computing system 100 including an apparatus including a storage controller 104 and a number of memory devices 116-1, . . . , 116-N in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1, memory devices 116-1 . . . 116-N can include a one or more memory modules (e.g., single in-line memory modules, dual in-line memory modules, etc.). The memory devices 116-1, . . . , 116-N can include volatile memory and/or non-volatile memory. In a number of embodiments, memory devices 116-1, . . . , 116-N can include a multi-chip device. A multi-chip device can include a number of different memory types and/or memory modules. For example, a memory system can include non-volatile or volatile memory on any type of a module.

The memory devices 116-1, . . . , 116-N can provide main memory for the computing system 100 or could be used as additional memory or storage throughout the computing system 100. Each memory device 116-1, . . . , 116-N can include one or more arrays of memory cells, e.g., volatile and/or non-volatile memory cells. The arrays can be flash arrays with a NAND architecture, for example. Embodiments are not limited to a particular type of memory device. For instance, the memory device 116 can include SRAM, RAM, ROM, DRAM, SDRAM, PCRAM, RRAM, and flash memory, among others. In some embodiments, the memory devices 116 can include a cache, one or more registers, latches, etc.

In embodiments in which the memory devices 116 include non-volatile memory, the memory devices 116 can be flash memory devices such as NAND or NOR flash memory devices. Embodiments are not so limited, however, and the memory devices 116 can include other non-volatile memory devices such as non-volatile random-access memory devices (e.g., NVRAM, ReRAM, FeRAM, MRAM, PCM), "emerging" memory devices such as 3-D Crosspoint (3D XP) memory devices, etc., or combinations thereof. A 3D XP array of non-volatile memory can perform bit storage based on a change of bulk resistance, in conjunction with a stackable cross-gridded data access array. Additionally, in contrast to many flash-based memories, 3D XP non-volatile memory can perform a write in-place operation, where a non-volatile memory cell can be programmed without the non-volatile memory cell being previously erased.

As illustrated in FIG. 1, a host 102 can be coupled to a storage controller 104, which can in turn be coupled to the memory devices 116. In a number of embodiments, each memory device 116 can be coupled to the storage controller 104 via one or more channels 107-1, . . . , 107-N (e.g., buses, interfaces, communication paths, etc.). In FIG. 1, the storage controller 104, which includes a network on a chip 108, is coupled to the host 102 via one or more channels 103 (e.g., buses, interfaces, communication paths, etc.) and the orchestration controller 106 is coupled to the host 102 via one or more channels 105 (e.g., buses, interfaces, communication paths, etc.). The host 102 can be a host system such as a personal laptop computer, a desktop computer, a digital camera, a smart phone, a memory card reader, and/or internet-of-things enabled device, among various other types of hosts, and can include a memory access device, e.g., a processor (or processing unit). One of ordinary skill in the art will appreciate that "a processor" can intend one or more processors, such as a parallel processing system, a number of coprocessors, etc.

The channel(s) 103/105/107 can be used to transfer data between the memory device(s) 116, the storage controller 104, and a host 102 and can be in the form of a standardized interface. For example, when the memory device(s) 116 are used for data storage in a computing system 100, the channel(s) 103/105/107 can be a serial advanced technology attachment (SATA), peripheral component interconnect express (PCIe), a universal serial bus (USB), or a double data rate (DDR) interface, among other connectors and interfaces. In general, however, channel(s) 103/105/107 can provide an interface for passing control, address, data, and other signals between the memory device(s) 116, the storage controller 104, and a host 102 having compatible receptors for the channels 103/105/107.

The host 102 can include a system motherboard and/or backplane and can include a number of processing resources (e.g., one or more processors, microprocessors, or some other type of controlling circuitry). The system 100 can include separate integrated circuits or the host 102, the storage controller 104, the orchestration controller 106, the network-on-chip (NoC) 108, and/or the memory devices 116 can be on the same integrated circuit. The system 100 can be, for instance, a server system and/or a high performance computing (HPC) system and/or a portion thereof. Although the example shown in FIG. 1 illustrate a system having a Von Neumann architecture, embodiments of the present disclosure can be implemented in non-Von Neumann architectures, which may not include one or more components (e.g., CPU, ALU, etc.) often associated with a Von Neumann architecture.

The storage controller 104 can include an orchestration controller 106, a network on a chip (NoC) 108, a plurality of computing tiles 110-1, . . . , 110-N, which are described in more detail in connection with FIGS. 5 and 6, herein, and a media controller 112. The computing tiles 110 can be referred to herein in the alternative as "computing devices." The orchestration controller 106 can include circuitry and/or logic configured to allocate and de-allocate resources to the computing tiles 110 during performance of operations described herein. In some embodiments, the orchestration controller 106 can be an application specific integrated circuit (ASIC), a field programmable gate array (FPGA), or other combination of circuitry and/or logic configured to orchestrate operations performed by the computing tiles 110.

For example, the orchestration controller 106 can include circuitry (e.g., one or more processors or processing units) and/or logic to control the computing tiles 110 to perform operations on received bit strings to convert the bit string between one or more formats, perform arithmetic and/or logical operations on the bit strings, and/or vary the precision (e.g., a dynamic range, accuracy, etc.) of the bit strings. Although not explicitly shown in FIG. 1, in some embodiments, the storage controller 104 can be resident on one or more of the memory devices 116.

The orchestration controller 106 can be configured to request a bit string (e.g., a block of data comprising one or more bit strings) from one or more of the memory devices 116 and cause the computing tiles 110 to perform an operation (e.g., an operation to convert the bit string between one or more formats, an arithmetic operation, a logical operation, a bitwise operation, etc.) on the bit string. The operation may be performed to convert a bit string from a first format (e.g., a floating-point format) to a second format (e.g., a universal number or posit format). The orchestration controller 104 can be further configured to cause the bit string that has been operated on (e.g., a bit string in the posit format, a resultant bit string that represents a result of an arithmetic and/or logical operation performed by the computing tiles 110, etc.) to be transferred to and from the interface (e.g., communication paths 103 and/or 105) and/or the host 102.

Non-limiting examples of arithmetic and/or logical operations that can be performed using the bit strings by the computing tiles 110 can include arithmetic operations such as addition, subtraction, multiplication, division, fused multiply addition, multiply-accumulate, dot product units, greater than or less than, absolute value (e.g., FABS( )), fast Fourier transforms, inverse fast Fourier transforms, sigmoid function, convolution, square root, exponent, and/or logarithm operations, and/or logical operations such as AND, OR, XOR, NOT, etc., as well as trigonometric operations such as sine, cosine, tangent, etc. using the posit bit strings. As will be appreciated, the foregoing list of operations is not intended to be exhaustive, nor is the foregoing list of operations intended to be limiting, and the computing tiles 110 may be configured to perform (or cause performance of) other arithmetic and/or logical operations.

In some embodiments, the orchestration controller 106 can be one of the plurality of computing tiles 110. For example, the orchestration controller 106 can include the same or similar circuitry that the computing tiles 110 include, as described in more detail in connection with FIG. 4B, herein. However, in some embodiments, the orchestration controller 106 can be a distinct or separate component from the computing tiles 110, and may therefore include different circuitry than the computing tile 110, as shown in FIG. 1.

The NoC 108 can be a communication subsystem that allows for communication between the orchestration controller 106 and the computing tiles 110. The NoC 108 can include circuitry and/or logic to facilitate the communication between the orchestration controller 106 and the computing tiles 110. In some embodiments, as described in more detail in connection with FIG. 2, herein, the NoC 108 can receive an output from the computing tiles 110 and transfer the output from the computing tiles 110 to the orchestration controller 106, the host 102, and/or the memory devices 116, and vice versa. For example, the NoC 108 may be configured to receive a bit string that has been subjected to an arithmetic operation, logical operation, etc. (e.g., a resultant bit string) by the computing tiles 110 subsequent to the bit string being converted to the universal number of posit format, and transfer the resultant bit string to the orchestration controller 106 the host 102, and/or the memory devices 116. As used herein, a "resultant bit string" generally refers to a bit string that results from performance of an arithmetic and/or logical operation. For example, if a first bit string "Ψ" and a second bit string "Ω" are used as operands in performance of an arithmetic and/or logical operation, a bit string "λ" that results from performance of the arithmetic and/or logical operation using the bit string operands "Ψ" and "Ω" can be referred to as a resultant bit string.

Although a NoC 108 is shown in FIG. 1, embodiments are not limited to utilization of a NoC 108 to provide a communication path between the orchestration controller 106 and the computing tiles 110. For example, other communication paths such as a storage controller crossbar (XBAR) may be used to facilitate communication between the computing tiles 110 and the orchestration controller 106.

The media controller 112 can be a "standard" or "dumb" media controller. For example, the media controller 112 can be configured to perform operations such as copy, write, read, error correct, etc. for the memory devices 116. However, in some embodiments, the media controller 112 does not perform operations to process (e.g., operations to convert bit strings between various formats, arithmetic and/or logical operations using the converted bit strings, etc.) on data associated with the memory devices 116. For example, the media controller 112 can cause a read and/or write operation to be performed to read or write data from or to the memory devices 116 via the channel(s) 107, but the media controller 112 may not perform operations to convert bit strings between various formats, arithmetic and/or logical operations on converted bit strings, etc. on the data read from or written to the memory devices 116. In some embodiments, the media controller 112 can be a non-volatile media controller, although embodiments are not so limited.

The embodiment of FIG. 1 can include additional circuitry that is not illustrated so as not to obscure embodiments of the present disclosure. For example, the storage controller 104 can include address circuitry to latch address signals provided over I/O connections through I/O circuitry. Address signals can be received and decoded by a row decoder and a column decoder to access the memory devices 116. It will be appreciated by those skilled in the art that the number of address input connections can depend on the density and architecture of the memory devices 116.

Figure 5:
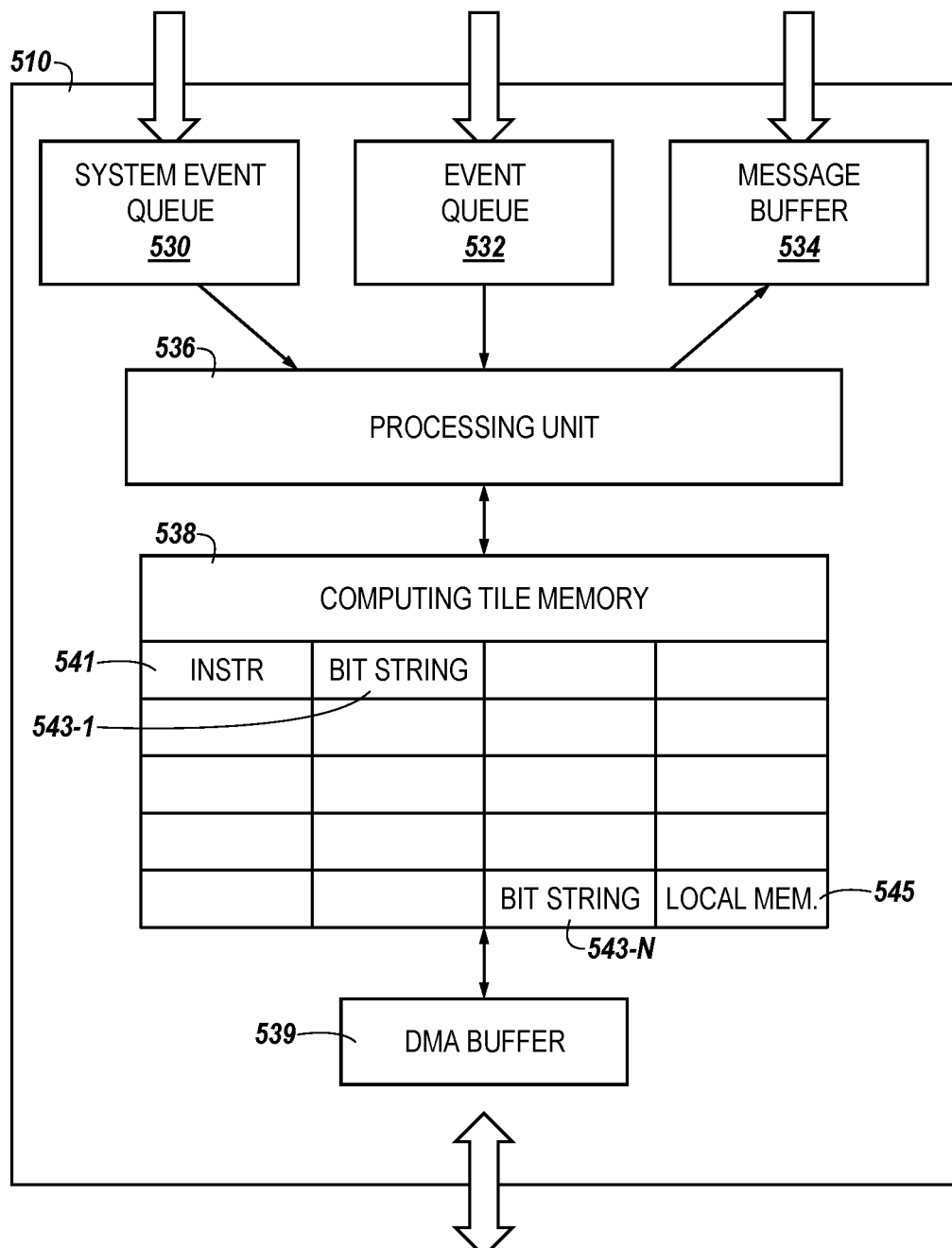
FIG. 5 is a block diagram in the form of a computing tile in accordance with a number of embodiments of the present disclosure.
Figure 6:
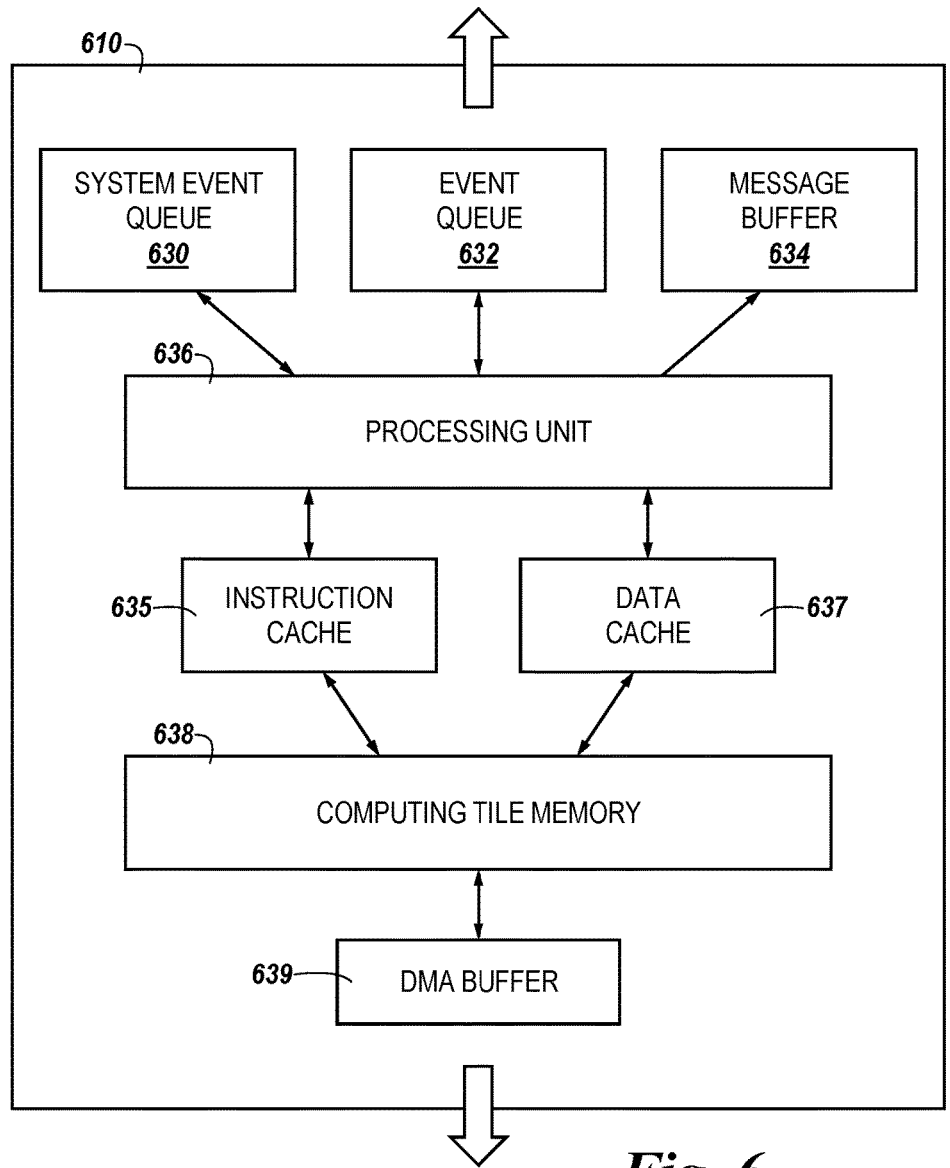
FIG. 6 is another block diagram in the form of a computing tile in accordance with a number of embodiments of the present disclosure.

In some embodiments, the computing tiles 110 (e.g., "computing devices") can each include processing unit (e.g., the processing unit 536/636 illustrated in FIGS. 5 and 6, herein) and a memory array (e.g., the computing tile memory resources 538/638 illustrated in FIGS. 5 and 6, herein) configured as a cache for the processing unit. An interface (e.g., the NoC 108) can be coupled to the plurality of computing devices and to the host 102. A controller, such as the orchestration controller 106 can be coupled to the computing tiles 110 and can comprise circuitry configured to request data comprising a bit string having a first format that supports arithmetic operations to a first level of precision from a memory device 116 and cause the processing unit of at least one computing device of the plurality of computing devices to perform an operation in which the bit string is converted to a second format that supports arithmetic operations to a second level of precision that is different from the first level of precision.

As used herein, a "first level of precision" and a "second level of precision" generally refer to the dynamic range of a bit string and/or a resultant bit string that represent a result of an operation performed using one or more bit strings. For example, floating-point format bit strings can be described herein as having a "first level of precision," while unum bit strings (e.g., posit format bit strings) can be referred to as having a "second level of precision," because, as described in more detail herein, unum bit strings, such as posit bit strings can offer a different level of precision than floating-point formatted bit strings. For example, under certain conditions, unum bit strings, such as posit bit strings can offer a higher level of precision than floating-point formatted bit strings.

In some embodiments, the first format or the second format can include a mantissa, a base, and an exponent portion and the other of the first format or the second format can include a mantissa, a sign, a regime, and an exponent portion. For example, if the first format includes a mantissa, a base, and an exponent portion, the second format can include a mantissa, a sign, a regime, and an exponent portion. Stated alternatively, in some embodiments, the first format or the second format can be an IEE 754 format, such as a floating-point format, and the other of the first format and the second format can be a unum format, such as a Type III unum or posit.

In some embodiments, the processing unit of the at least one computing device is configured to perform an arithmetic operation or a logical operation, or both, using the bit string having the second format. As described above, non-limiting examples of arithmetic and/or logical operations that can be performed using the bit strings by the computing tiles 110 can include arithmetic operations such as addition, subtraction, multiplication, division, fused multiply addition, multiply-accumulate, dot product units, greater than or less than, absolute value (e.g., FABS( )), fast Fourier transforms, inverse fast Fourier transforms, sigmoid function, convolution, square root, exponent, and/or logarithm operations, and/or logical operations such as AND, OR, XOR, NOT, etc., as well as trigonometric operations such as sine, cosine, tangent, etc. using the posit bit strings. As will be appreciated, the foregoing list of operations is not intended to be exhaustive, nor is the foregoing list of operations intended to be limiting, and the computing tiles 110 may be configured to perform (or cause performance of) other arithmetic and/or logical operations.

Embodiments are not limited to performance of arithmetic and/or logical operations, however, and in some embodiments, the controller can be further configured to cause the processing unit of the at least one computing device of the plurality of computing devices to perform an operation on the data in which at least some of the data is ordered, reordered, removed, or discarded, as described in more detail in connection with FIGS. 5 and 6, herein.

Another controller (e.g., the media controller 112) can be coupled to the plurality of computing devices. The other controller (e.g., the controller that is different than the orchestration controller 106) can comprise circuitry configured to perform read operations associated with the memory device, copy operations associated with the memory device, error correction operations associated with the memory device, or combinations thereof. However, in some embodiments, the other controller may be configured to not perform conversion operations, arithmetic operations, and/or logical operations on the bit strings.

In some embodiments, the memory device 116 can be coupled to the host 102 and can include at least a first computing tile 110-1 (e.g., a computing device) and a second computing tile 110-2. For example, the computing tiles 110 and/or the storage controller 104 can be resident on the memory device(s) 116. The first computing device can include a first processing unit and a first memory array configured as a cache for the first processing unit and the second computing device can include a second processing unit and a second memory array configured as a cache for the second processing unit.

A controller (e.g., the orchestration controller 206) can be coupled to the first computing device and the second computing device and can be configured to allocate at least one of the first computing device and the second computing device to perform an operation in which data comprising a bit string having a first format that supports arithmetic operations to a first level of precision is converted to a second format that supports arithmetic operations to a second level of precision that is different from the first level of precision and cause the at least one of the first computing device and the second computing device to perform the operation in which the bit string is converted to the second format. In some embodiments, at least one of the first format and the second format comprises an IEEE 754 format and the other of the first format and the second format comprises a Type III universal number format or a posit format.

The processing unit of the first computing device or the second computing device can be configured to perform an arithmetic operation or a logical operation, or both, using the bit string having the second format. In some embodiments, the processing unit of the first computing device or the second computing device can be configured to perform the arithmetic operation or the logical operation, or both, using the bit string having the second format responsive to completion of the operation to convert the bit string to the second format. For example, at least one of the first computing device and the second computing device is configured to perform the arithmetic operation and/or the logical operation responsive to completion of the operation to convert the bit strings from the first format to the second format in the absence of a command from the host 102.

As described in more detail in connection with FIGS. 2 and 3, the controller can be configured to cause at least one of the bit string having the first format and the bit string having the second format to be converted to a logical record as part of performance of the operation.

Another controller (e.g., the media controller 112) can be coupled to the memory device 116. The other controller (e.g., the controller that is different than the orchestration controller 106) can comprise circuitry configured to perform read operations associated with the memory device, copy operations associated with the memory device, error correction operations associated with the memory device, or combinations thereof. However, in some embodiments, the other controller may not be configured to perform conversion operations, arithmetic operations, and/or logical operations using the bit strings.

In some embodiments, the first computing device and the second computing device can be configured such that the first computing device can access an address space associated with the second computing device and the second computing device can access an address space associated with the first computing device, as described in more detail, herein. For example, the NoC 108 can facilitate address visibility between the computing devices to allow the computing devices to access bit strings stored in other computing devices and/or to allow for parallel performance of operations using the bit strings.

Figure 2:
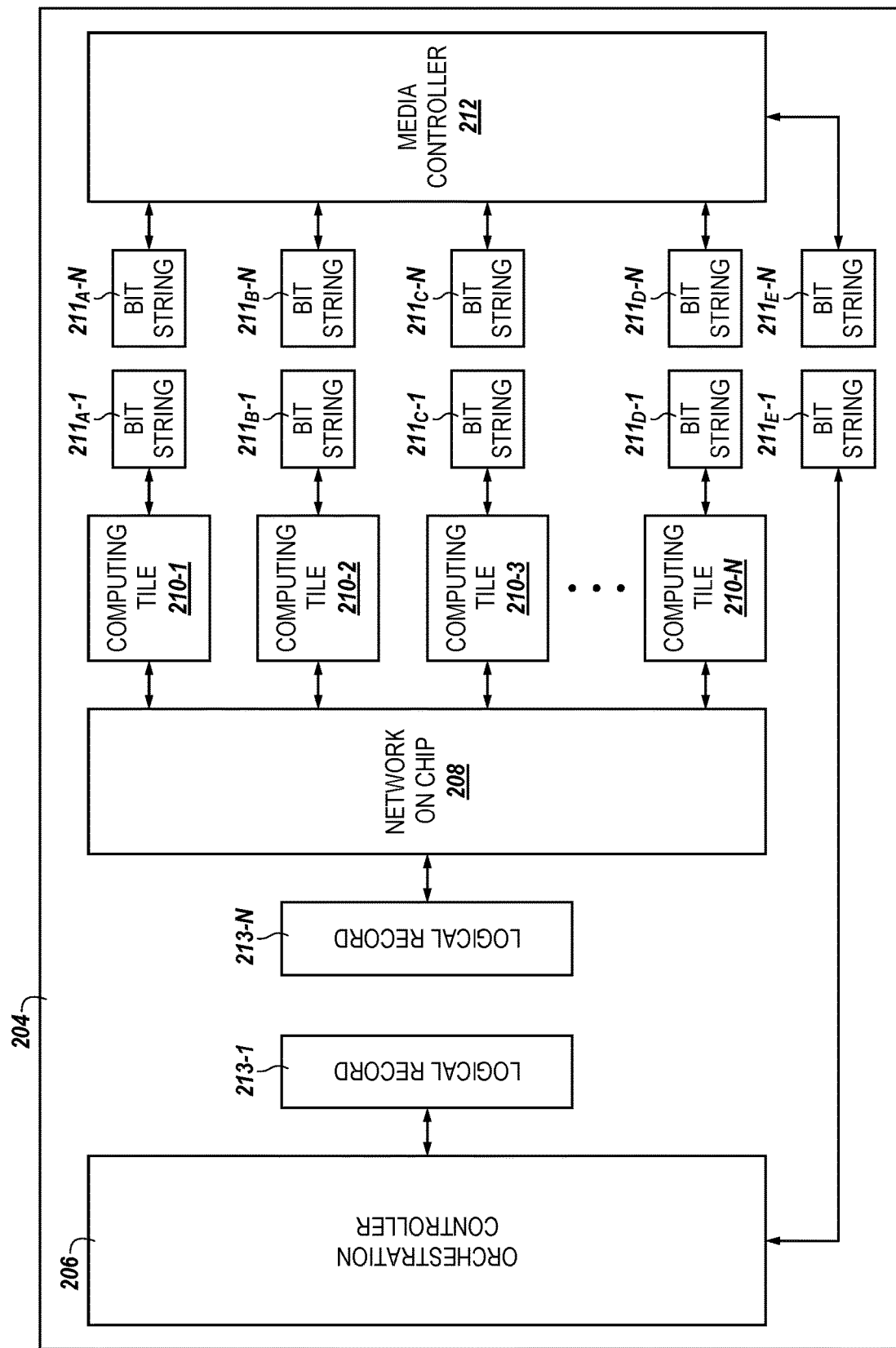
FIG. 2 is a functional block diagram in the form of an apparatus including a storage controller in accordance with a number of embodiments of the present disclosure.

FIG. 2 is a functional block diagram in the form of an apparatus including a storage controller 204 in accordance with a number of embodiments of the present disclosure. The storage controller 204 can be analogous to the storage controller 104 illustrated in FIG. 1. As shown in FIG. 2, the storage controller 204 can include a media controller 212, a plurality of computing tiles 210-1, . . . , 210-N, a network on chip (NoC) 208, and an orchestration controller 206.

The media controller 212 can be configured to retrieve bit strings $211_A$-1, . . . , $211_A$-N, $211_B$-1, . . . , $211_B$-N, $211_C$-1, . . . , $211_C$-N, $211_D$-1, . . . , $211_D$-N, $211_E$-1, . . . , $211_E$-N from a memory device (e.g., memory device(s) 116-1, . . . , 116-N illustrated in FIG. 1) coupled to the storage controller 204 in response to a request from the orchestration controller 206. The media controller can subsequently cause the bit strings $211_A$, $211_B$, $211_C$, $211_D$, $211_E$ to be transferred to the computing tiles 210 and/or the orchestration controller 206. In some embodiments, the bit strings can be included in one or more blocks of data. A block of data can be around 4 kilobytes in size and contain multiple bit strings, although embodiments are not limited to this particular size. Similarly, the media controller 212 can be configured to receive bit strings $211_A$, $211_B$, $211_C$, $211_D$, $211_E$ from the computing tiles 210 and/or the orchestration controller 206. The media controller can subsequently cause the bit strings $211_A$, $211_B$, $211_C$, $211_D$, $211_E$ to be transferred to a memory device coupled to the storage controller 204.

The bit strings 211 can be processed in a streaming manner by the computing tiles 210 in response to one or more commands generated by the orchestration controller 206. For example, as described in more detail in connection with FIGS. 5 and 6, herein, because the computing tiles 210 can process a subsequent bit string 211 in response to completion of a process on a preceding bit string 211, the bit strings 211 can be continuously streamed through the computing tiles 210 while the bit strings 211 are being processed by the computing tiles 210. In some embodiments, the bit strings 211 can be processed in a streaming fashion through the computing tiles 210 in the absence of an intervening command from the orchestration controller 206. That is, in some embodiments, the orchestration controller 206 can issue a command to cause the computing tiles 210 to process bit strings 211 received thereto and bit strings 211 that are subsequently received by the computing tiles 210 can be processed in the absence of an additional command from the orchestration controller 206. As used herein, processing the bit strings can include performing operations to convert the bit strings between various formats (e.g., between the floating-point format and a universal number format, such as a posit format, and vice versa), performing arithmetic and/or logical operations using the converted bit strings, and/or converting the resultant bit strings between various formats.

The bit strings 211 can be formatted in various formats. For example, the bit strings 211 can be formatted in an IEEE 754 format, such as a floating-point format, a universal number format, such as a posit format, or combinations thereof. One of ordinary skill will appreciate that the bit strings 211 may be formatted in other formats as well.

As described above, in some embodiments, processing the bit strings 211 can include performing operations to convert the bit strings 211 between different formats and/or performing arithmetic and/or logical operations using the bit strings 211 as operands. For example, the computing tiles 210 can, in response to commands from the orchestration controller 206, perform operations on the bit strings 211 to convert the bit strings 211 between different formats and/or performing arithmetic and/or logical operations using the bit strings 211 as operands. In some embodiments, the computing tiles 210 can, in response to commands from the orchestration controller 206, perform operations on the bit strings 211 in which at least some of the bit strings 211 are ordered, reordered, removed, or discarded to remove unwanted data, extract relevant data, or otherwise parse the bit strings 211 to reduce a size or quantity of data associated therewith.

In a non-limiting example, the bit strings 211 can include one or more floating-point bit strings. The orchestration controller 206 can send a command to the computing tiles 210 to cause the computing tiles 210 to receive the bit strings 211 in the floating-point format. Responsive to receipt of the bit strings 211 in the floating-point format, the computing tiles 210 can initiate operations to convert the bit strings 211 to bit strings 211 in a universal number format, such as a posit format.

The computing tiles 210 can, subsequent to performing the operation to convert the bit strings 211 from the floating-point format to the posit format, perform arithmetic and/or logical operations using the converted bit strings 211. In some embodiments, the computing tiles 210 can initiate performance of the arithmetic and/or logical operation using the converted bit strings 211 without receipt of a command (e.g., a command to retrieve the bit sting(s) 211) from the orchestration controller 206, however, embodiments are not so limited, and the computing tiles 210 can initiate performance of the arithmetic and/or logical operation using the converted bit strings 211 in response to one or more subsequent commands from the orchestration controller 206. Subsequent to performance of the arithmetic and/or logical operations, the computing tiles 210 can transfer a result of the arithmetic and/or logical operations out of the computing tiles 210 to circuitry external to the computing tiles 210 (e.g., to the orchestration controller 204, the NoC 208, and/or a host, such as the host 102 illustrated in FIG. 1, herein).

In some embodiments, the computing tiles 210 (e.g., a plurality of computing devices) can each include a respective memory resource (the computing tile memory resources 538/638 illustrated in FIGS. 5 and 6, herein) and a respective processing unit (e.g., the processing units 538/638 illustrated in FIGS. 5 and 6, herein). The computing devices can be configured to receive respective streams of data comprising one or more bit strings 211 and perform operations on the one or more bit strings to convert the one or more bit strings form a first format that supports arithmetic operations to a first level of precision to a second format that supports arithmetic operations to a second level of precision that is different from the first level of precision. The computing devices may be configured to perform an arithmetic operation or a logical operation, or both, using one or more bit strings having the second format.

In some embodiments, a communication subsystem (e.g., the NoC 208) can be coupled to the plurality of computing devices. The communication subsystem can be configured to provide communications pathways to allow at least one of computing devices to access an address space associated with a different computing device, as described herein. A controller, such as the orchestration controller 206 can be coupled to the plurality of computing devices and be configured to allocate particular computing devices among the plurality of computing devices to perform the operations on the one or more bit strings.

The computing devices can be configured to initiate the operations on the one or more bit strings in response to receipt of an initiation command, and/or the computing devices can configured to receive the respective streams of data and perform the operations on the one or more bit strings in the absence of a command subsequent to the initiation command. For example, the computing devices can be provisioned with sufficient processing resources to perform the operations without encumbering a host (e.g., the host 102 illustrated in FIG. 1) or other circuitry external to the storage controller 204, and/or a controller such as the orchestration controller 206.

The computing devices can further include respective direct media access (DMA) components, such as the DMA buffers 539 and 639 illustrated in FIGS. 5 and 6. The DMA components can be configured to buffer subsequent bit strings received as part of the respective streams of data while the operations are performed on preceding bit strings and/or cause the subsequent bit strings to be transferred to the respective memory resources in response to completion of the operations on the preceding bit strings, as described in more detail, herein.

In a non-limiting example in which two bit strings $\Lambda$ and $\Pi$ are requested from a block of data containing three bit strings $\Lambda$, $\Pi$, and $\beta$, the block of data containing all three columns can be transferred to the computing tiles 210 in response to a command from the orchestration controller 206. The computing tiles 210 can selectively process the block of data to extract the relevant bit strings (e.g., bit string $\Lambda$ and bit string $\Pi$) from the block of data, and can subsequently transfer the filtered data (e.g., the relevant bit strings) out of the computing tiles 210 to circuitry external to the computing tiles 210 (e.g., to the orchestration controller 206, the NoC 208, a memory device, such as the memory devices 116 illustrated in FIG. 1, and/or a host, such as the host 102 illustrated in FIG. 1). In some embodiments, the computing tiles 210 can perform operations (e.g., operations to convert the bit strings between various formats, arithmetic and/or logical operations using the bit string, and/or operations to convert resultant bit strings between various formats) using the filtered bit strings.

The orchestration controller 206 can be further configured to send commands to the computing tiles 210 to allocate and/or de-allocate resources available to the computing tiles 210 for use in performing operations using the bit strings 211. In some embodiments, allocating and/or de-allocating resources available to the computing tiles 210 can include selectively enabling some of the computing tiles 210 while selectively disabling some of the computing tiles 210. For example, if less than a total number of computing tiles 210 are required to perform operations using the bit strings 211, the orchestration controller 206 can send a command to the computing tiles 210 that are to be used for performing operations using the bit strings 211 to enable only those computing tiles 210 desired to perform operations using the bit strings 211.

In some embodiments, allocating resources available to the computing tiles 210 can serve to conserve an amount of power consumed by the computing tiles when fewer than all the computing tiles 210 are required in performance of operations. Conversely, when multiple operations or sub-operations are desired, allocating resources available to the computing tiles 210 can allow for improved processing speed by performing operations in parallel across multiple computing tiles 210.

The orchestration controller 206 can, in some embodiments, be further configured to send commands to synchronize performance of operations and/or sub-operations performed by the computing tiles 210. For example, the orchestration controller 206 can send a command to a first computing tile (e.g., the computing tile 210-1) to cause the first computing tile to perform a first operation, and the orchestration controller 206 can send a command to a second computing tile (e.g., the computing tile 210-2) to perform a second operation using the second computing tile. Synchronization of performance of operations performed by the computing tiles 210 by the orchestration controller 206 can further include causing the computing tiles 210 to perform particular operations at particular time or in a particular order.

In a non-limiting example, the orchestration controller 206 can send a command to one of the computing tiles (e.g., the computing tile 210-1) to perform an operation using one or more bit strings 211 and a different command to a different one of the computing tiles (e.g., the computing tile 210-2) to perform an operation using one or more of the bit strings 211. For example, the orchestration controller 206 can send a command to one of the computing tiles (e.g., the computing tile 210-1) to perform a conversion operation, an arithmetic operation, and/or a logical operation using one or more of the bit strings 211 and a different command to one of the computing tiles (e.g., the computing tile 210-2) to perform a conversion operation, an arithmetic operation, and/or a logical operation using one or more of the bit strings 211.

In another non-limiting example, the orchestration controller 206 can send a command to one of the computing tiles (e.g., the computing tile 210-1) to perform a sub-operation using one or more bit strings 211 and a different command to a different one of the computing tiles (e.g., the computing tile 210-2) to perform another sub-operation using one or more of the bit strings 211 as part of performing an operation using the one or more bit strings 211. For example, the orchestration controller 206 can send a command to one of the computing tiles (e.g., the computing tile 210-1) to perform a portion of an arithmetic operation, and/or a logical operation using one or more of the bit strings 211 and another command to one of the computing tiles (e.g., the computing tile 210-2) to perform another portion of the arithmetic operation, and/or the logical operation using one or more of the bit strings 211. Once the respective portions (e.g., the sub-operations) of the operation are performed, the orchestration controller 206 can cause the sub-operations to be combined to yield the resulting operation performed using the one or more bit strings.

In some embodiments, the resultant bit strings 211 (e.g., bit strings that represent a result of the conversion operation), the arithmetic operation, and/or the logical operation can be converted into logical records 213-1, . . . , 213-N subsequent to performance of operations using the bit strings 211 by the computing tiles 210. The logical records 213 can comprise data records that are independent of their physical locations. For example, the logical records 213 may be data records that point to a location in at least one of the computing tiles 210 where physical data corresponding to the bit strings 211 (e.g., the block of data in which a result of a conversion operation, an arithmetic operation, and/or a logical operation using the bit strings 211) is stored.

As described in more detail in connection with FIGS. 5 and 6, herein, the resultant bit strings 211 can be stored in a partition of a computing tile memory (e.g., the computing tile memory 538 illustrated in FIG. 5 or the computing tile memory 638 illustrated in FIG. 6) that is different than a partition in which the bit string 211 is stored prior to performance of the conversion operation, the arithmetic operation, and/or the logical operation. In some embodiments, the logical records 213 can point to the location in which the resultant bit string(s) is stored such that the resultant bit string(s) can be accessed from the computing tiles 210 and transferred to circuitry external to the computing tiles 210.

In some embodiments, the orchestration controller 2026 can receive and/or send bit strings $211_E$-1, . . . , $211_E$-N directly to and from the media controller 212. This can allow the orchestration controller 206 to transfer bit strings $211_E$ that are not processed (e.g., bit strings 211 that are not subject to conversion operations, arithmetic operations, and/or logical operations) by the computing tiles 210) by the computing tiles 210 between the media controller 212 and the orchestration controller 206 and/or a host, such as the host 102 illustrated in FIG. 1.

For example, if the orchestration controller 206 receives unprocessed bit strings $211_E$ from a host (e.g., the host 102 illustrated in FIG. 1) coupled to the storage controller 204 that are to be stored by memory device(s) (e.g., the memory devices 116 illustrated in FIG. 1) coupled to the storage controller 204, the orchestration controller 206 can cause the unprocessed bit strings $211_E$ to be transferred to the media controller 212, which can, in turn, cause the unprocessed bit strings $211_E$ to be transferred to memory device(s) coupled to the storage controller 204.

Similarly, if the host requests an unprocessed bit strings or a block of data that is not processed by the computing tiles 210), the media controller 212 can cause unprocessed bit strings $211_E$ to be transferred to the orchestration controller 206, which can subsequently transfer the unprocessed bit strings $211_E$ to the host.

Figure 3:
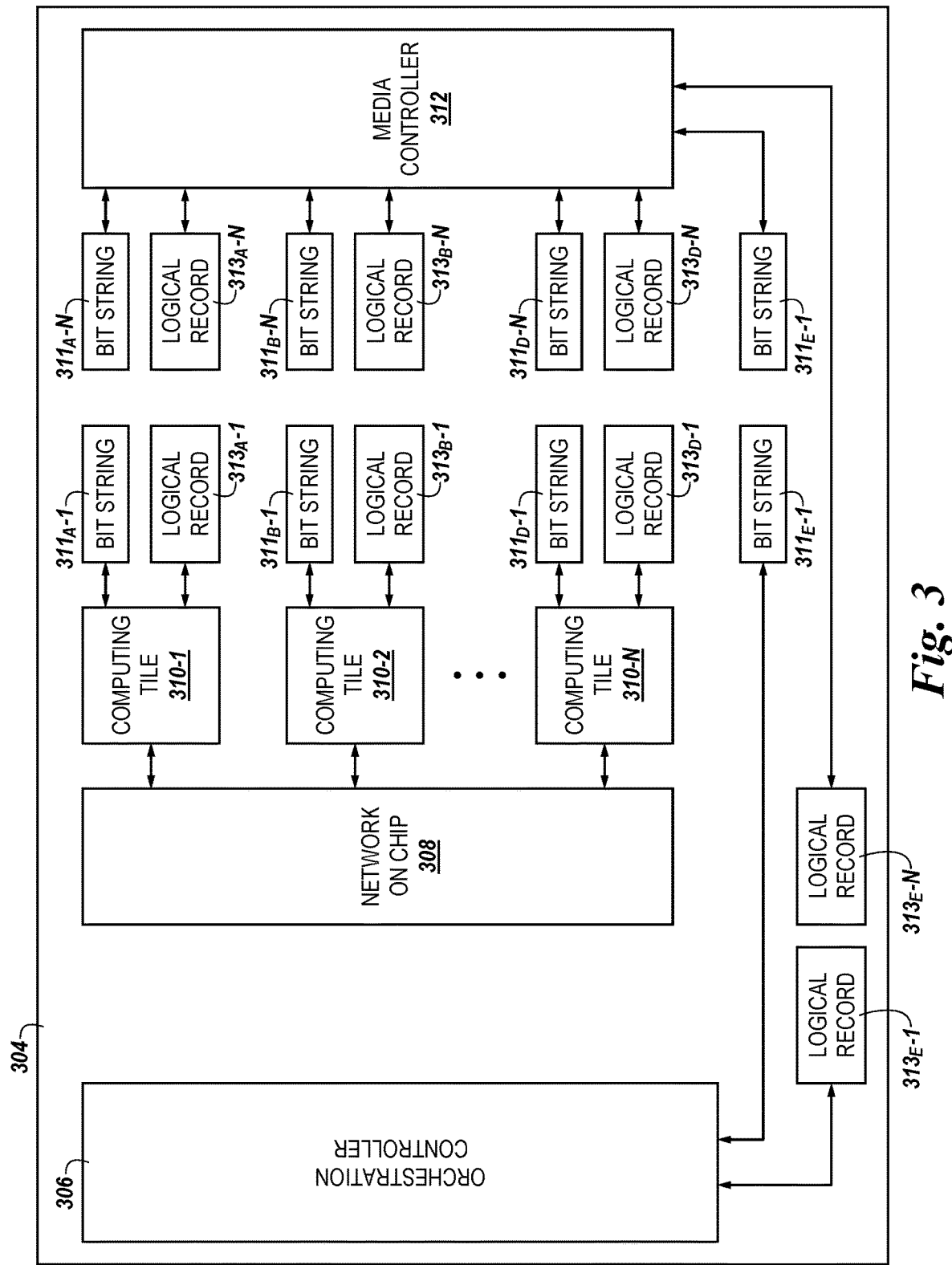
FIG. 3 is another functional block diagram in the form of an apparatus including a storage controller in accordance with a number of embodiments of the present disclosure.

FIG. 3 is another functional block diagram in the form of an apparatus including a storage controller 304 in accordance with a number of embodiments of the present disclosure. The storage controller 304 can be analogous to the storage controller 104 illustrated in FIG. 1 or the storage controller 204 illustrated in FIG. 2, herein. As shown in FIG. 3, the storage controller 304 can include a media controller 312, a plurality of computing tiles 310-1, . . . , 310-N, a network on chip (NoC) 308, and an orchestration controller 306.

The media controller 312 can be configured to retrieve bit strings $311_A$-1, . . . , $311_A$-N, $311_B$-1, . . . , $311_B$-N, $311_C$-1, . . . , $311_C$-N, $311_D$-1, . . . , $311_D$-N, $311_E$-1, . . . , $311_E$-N and/or logical records $313_A$-1, . . . , $313_A$-N, $313_B$-1, . . . , $313_B$-N, $313_C$-1, . . . , $313_C$-N, $313_D$-1, . . . , $313_D$-N, $313_E$-1, . . . , $313_E$-N from a memory device (e.g., memory device(s) 116-1, . . . , 116-N illustrated in FIG. 1) coupled to the storage controller 304 in response to a request from the orchestration controller 306. The media controller can subsequently cause the bit strings $311_A$, $311_B$, $311_C$, $311_D$, $311_E$- and/or logical records $313_A$, $313_B$, $313_C$, $313_D$, $313_E$ to be transferred to the computing tiles 310 and/or the orchestration controller 306.

Similarly, the media controller 312 can be configured to receive bit strings $311_A$, $311_B$, $311_C$, $311_D$, $311_E$ and/or logical records $313_A$, $313_B$, $313_C$, $313_D$, $313_E$ from the computing tiles 310 and/or the orchestration controller 306. The media controller can subsequently cause the bit strings $311_A$, $311_B$, $311_C$, $311_D$, $311_E$ and/or logical records $313_A$, $313_B$, $313_C$, $313_D$, $313_E$ to be transferred to a memory device coupled to the storage controller 304.

The bit strings 311 can be processed in a streaming manner by the computing tiles 310 in response to one or more commands generated by the orchestration controller 306. In some embodiments, processing the bit strings 311 can include performing various operations using the bit strings. For example, the computing tiles 310 can, in response to commands from the orchestration controller 306, perform operations on the bit strings 311 to convert the bit strings 311 between one or more different formats and/or perform arithmetic and/or logical operations using the bit strings 311. For example, the computing tiles 310 can receive bit strings 311 having a first format (e.g., a floating-point format) and convert the bit strings 311 such that the bit strings 311 have a second format (e.g., a universal number format, posit format, etc.).

Further, in some embodiments, the computing tiles 310-1, . . . , 310-N can, in response to commands from the orchestration controller 306, perform operations on the bit strings 311 to remove unwanted data, extract relevant data, or otherwise parse the bit strings 311 to reduce a size or quantity of data associated therewith. In some embodiments, the computing tiles 310-1, . . . , 310-N can, in response to commands from the orchestration controller 306, process bit strings 311, generate logical records 313, and/or transfer the logical records to a location external to the computing tiles 310.

Figure 4A:
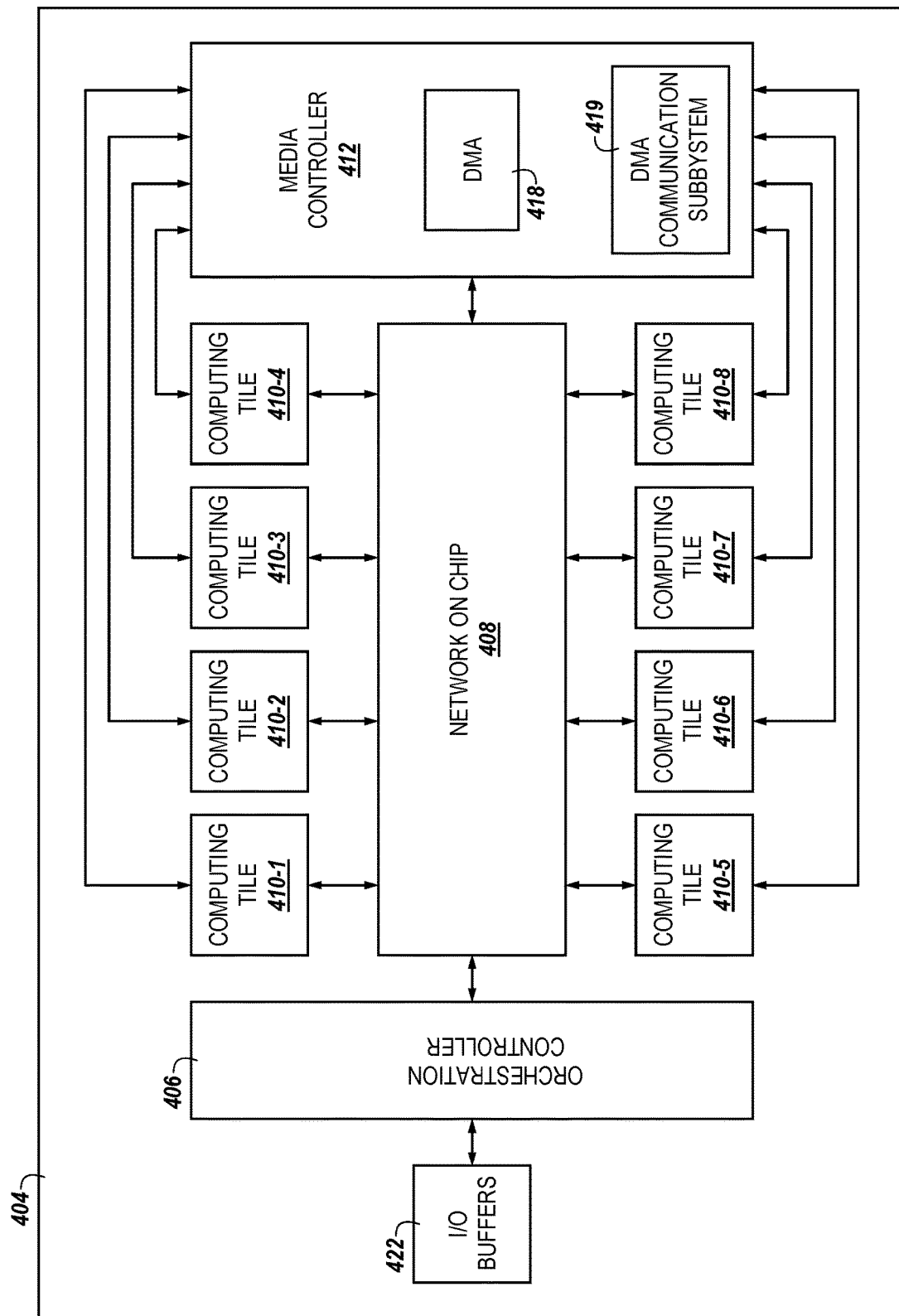
FIG. 4A is a functional block diagram in the form of an apparatus including a storage controller in accordance with a number of embodiments of the present disclosure.
Figure 4B:
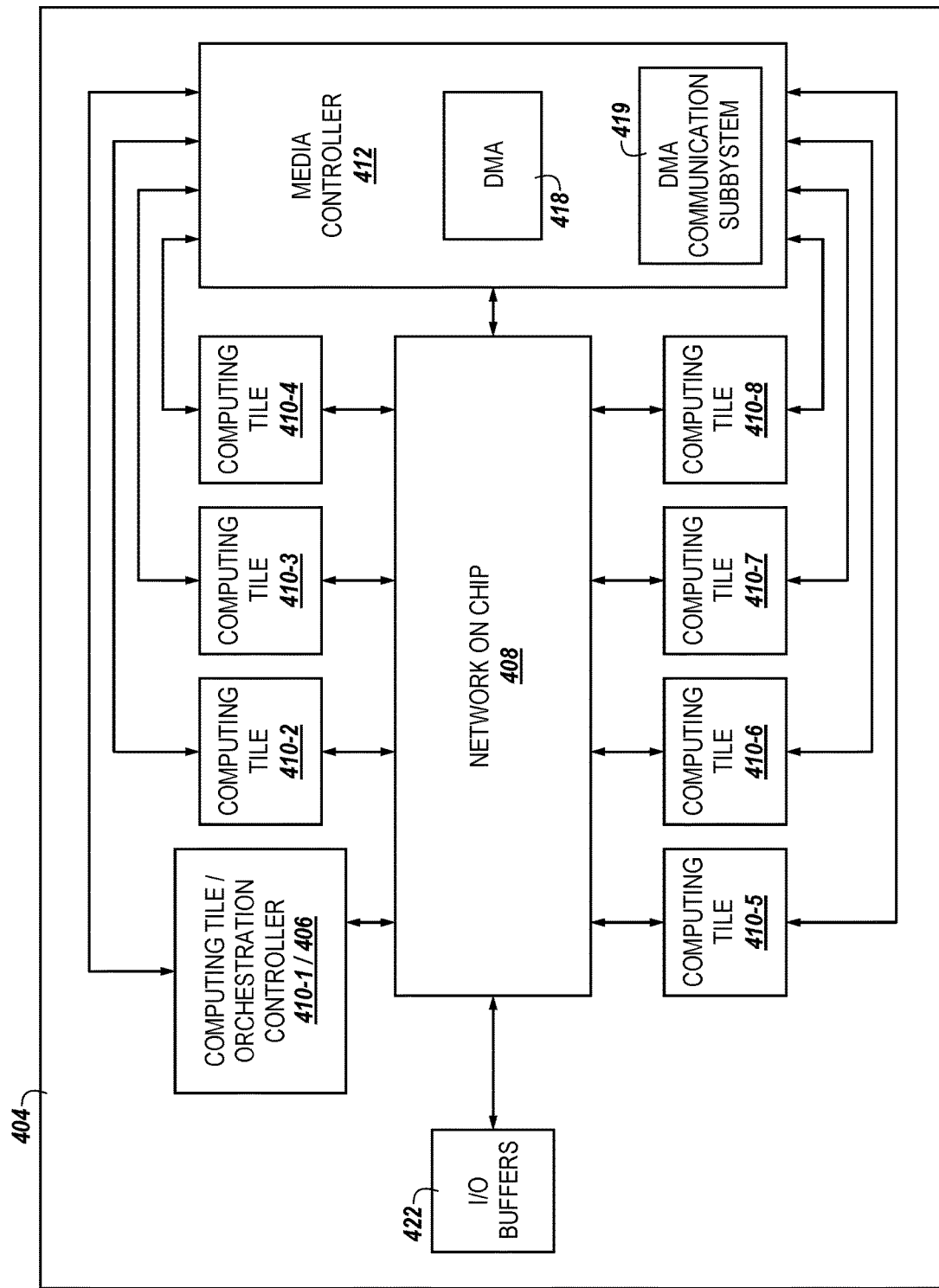
FIG. 4B is another functional block diagram in the form of an apparatus including a storage controller in accordance with a number of embodiments of the present disclosure.
Figure 4C:
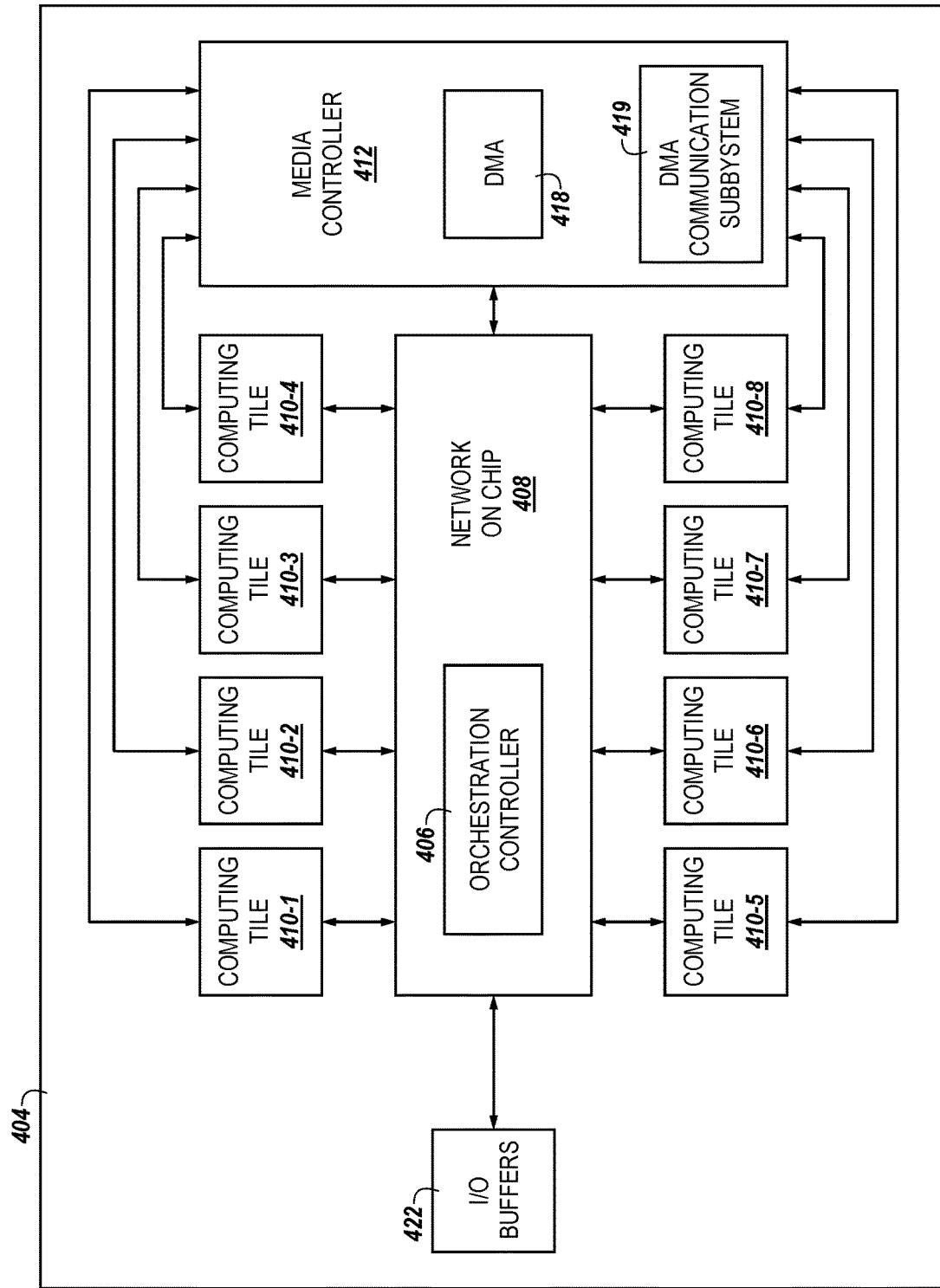
FIG. 4C is yet another functional block diagram in the form of an apparatus including a storage controller in accordance with a number of embodiments of the present disclosure.

FIGS. 4A-4C illustrate various examples of a functional block diagram in the form of an apparatus including a storage controller 404 in accordance with a number of embodiments of the present disclosure. In FIGS. 4A-4C, a media controller 412 is in communication with a plurality of computing tiles 410-1, . . . , 410-8, a NoC 408, and an orchestration controller 406, which is communication with input/output (I/O) buffers 422. Although eight (8) discrete computing tiles 410-1, . . . , 410-8 are shown in FIGS. 4A-4C, it will be appreciated that embodiments are not limited to a storage controller 404 that includes eight discrete computing tiles 410. For example, the storage controller 404 can include one or more computing tiles 410, depending on characteristics of the storage controller 404 and/or overall system in which the storage controller 404 is deployed.

As shown in FIGS. 4A-4C, the media controller 412 can include a direct memory access (DMA) component 418 and a DMA communication subsystem 419. The DMA 418 can facilitate communication between the media controller 418 and memory device(s), such as the memory devices 116-1, . . . , 116-N illustrated in FIG. 1, coupled to the storage controller 404 independent of a central processing unit of a host, such as the host 102 illustrated in FIG. 1. The DMA communication subsystem 419 can be a communication subsystem such as a crossbar ("XBAR"), a network on a chip, or other communication subsystem that allows for interconnection and interoperability between the media controller 412, the storage device(s) coupled to the storage controller 404, and/or the computing tiles 410.

In some embodiments, the NoC 408 can facilitate visibility between respective address spaces of the computing tiles 410. For example, each computing tile 410-1, . . . , 410-8 can, responsive to receipt of a bit string or other data (e.g., a file, etc.), store the data in a memory resource (e.g., in the computing tile memory 548 or the computing tile memory 638 illustrated in FIGS. 5 and 6, herein) of the computing tile 410. The computing tiles 410 can associate an address (e.g., a physical address) corresponding to a location in the computing tile 410 memory resource in which the bit string or data is stored. In addition, the computing tile 410 can parse the address associated with the bit string or data into logical blocks.

In some embodiments, the zeroth logical block associated with the bit string can be transferred to a processing unit (e.g., the processing unit 536 or the processing unit 636 illustrated in FIGS. 5 and 6, herein). A particular computing tile (e.g., computing tile 410-2) can be configured to recognize that a particular set of logical addresses are accessible to that computing tile 410-2, while other computing tiles (e.g., computing tile 410-3, 410-4, etc.) can be configured to recognize that different sets of logical addresses are accessible to those computing tiles 410. Stated alternatively, a first computing tile (e.g., the computing tile 410-2) can have access to a first set of logical addresses associated with that computing tile 410-2, and a second computing tile (e.g., the computing tile 410-3) can have access to a second set of logical address associated therewith, etc.

If a bit string or data corresponding to the second set of logical addresses (e.g., the logical addresses accessible by the second computing tile 410-3) is requested at the first computing tile (e.g., the computing tile 410-2), the NoC 408 can facilitate communication between the first computing tile and the second computing tile (e.g., the computing tile 410-3) to allow the first computing tile to access the bit string or data corresponding to the second set of logical addresses (e.g., the set of logical addresses accessible by the second computing tile 410-3). That is, the NoC 408 can facilitate communication between the computing tiles 410 to allows address spaces of the computing tiles 410 to be visible to one another.

In some embodiments, communication between the computing tiles 410 to facilitate address visibility can include receiving, by an event queue (e.g., the event queue 532 and 632 illustrated in FIGS. 5 and 6) of the first computing tile, a message requesting access to the bit string or data corresponding to the second set of logical addresses, loading the requested bit string or data into a memory resource (e.g., the computing tile memory 538 and 638 illustrated in FIGS. 5 and 6, herein) of the first computing tile, and/or transferring the requested bit string or data to a message buffer (e.g., the message buffer 534 and 634 illustrated in FIGS. 5 and 6, herein). Once the bit string or data has been buffered by the message buffer, the bit string or data can be transferred to the second computing tile via the NoC 408.

In other embodiments, an application requesting a bit string or data that is stored in the computing tiles 410 can know which computing tiles 410 include the bit string or data requested. For example, the application requesting a bit string or data stored in the computing tiles 410 may specify an address in which the bit string or data is stored as part of the request. In this example, the application can request the bit string or data from the relevant computing tile 410 and/or the address may be loaded into multiple computing tiles 410 and accessed by the application requesting the bit string or data via the NoC 408.

As shown in FIG. 4A, the orchestration controller 406 comprises discrete circuitry that is physically separate from the NoC 408. The NoC 408 can be a communication subsystem that is provided as one or more integrated circuits that allows communication between the computing tiles 410, the media controller 412, and/or the orchestration controller 406. Non-limiting examples of a NoC 408 can include a XBAR or other communications subsystem that allows for interconnection and/or interoperability of the orchestration controller 406, the computing tiles 410, and/or the media controller 412.

As described above, responsive to receipt of a command generated by the orchestration controller 406 and/or the NoC 408, performance of operations to convert bit strings between various formats, arithmetic operations, and/or logical operations using the bit strings using the bit strings streamed through the computing tiles 410 can be realized.

As shown in FIG. 4B, the orchestration controller 406 is resident on one of the computing tiles 410-1 among the plurality of computing tiles 410-1, . . . , 410-8. As used herein, the term "resident on" refers to something that is physically located on a particular component. For example, the orchestration controller 406 being "resident on" one of the computing tiles 410 refers to a condition in which the orchestration controller 406 is physically coupled to a particular computing tile. The term "resident on" may be used interchangeably with other terms such as "deployed on" or "located on," herein.

As described above, responsive to receipt of a command generated by the computing tile 410-1/orchestration controller 406 and/or the NoC 408, performance of operations to convert bit strings between various formats, arithmetic operations, and/or logical operations using the bit strings, as well as operations to extract relevant data from blocks of data streamed through the computing tiles 410 can be realized.

As shown in FIG. 4C, the orchestration controller 406 is resident on the NoC 408. In some embodiments, providing the orchestration controller 406 as part of the NoC 408 results in a tight coupling of the orchestration controller 406 and the NoC 408, which can result in reduced time consumption to perform operations using the orchestration controller 406. For example, in embodiments in which the orchestration controller 406 is resident on the NoC 408, a number of clock cycles consumed in performing operations such as operations to convert bit strings between various formats, as well as operations to perform arithmetic and/or logical operations using the bit strings, fewer clock cycles may be incurred in transferring the data from the orchestration controller 406 to the NoC 408 may be achieved in comparison to embodiments in which the orchestration controller 406 is physically distinct from the NoC 208.

As described above, responsive to receipt of a command generated by the orchestration controller 406 and/or the NoC 408, performance of operations to operations to convert bit strings between various formats, as well as operations to perform arithmetic and/or logical operations using bit strings streamed through the computing tiles 410 can be realized.

FIG. 5 is a block diagram in the form of a computing tile 510 in accordance with a number of embodiments of the present disclosure. As shown in FIG. 5, the computing tile 510 can include a system event queue 530, an event queue 532, and a message buffer 534. The computing tile 510 can further include a processing unit 536 such as a reduced instruction set computing (RISC) device, a computing tile memory 538 portion, and a direct memory access buffer 539. In some embodiments, the processing unit 536 can include one or more hardware processors, such as a central processing unit, a microprocessor, an advanced RISC machine (ARM) device, etc. In some embodiments, the processing unit 536 can employ an instruction set architecture (ISA) such as an x86 ISA, a reduced instruction set computer (e.g., a RISC-V) ISA, etc. Embodiments are not limited to these enumerated examples, however, and other processing units 536 and/or ISAs can be used.

The system event queue 530, the event queue 532, and the message buffer 534 can be in communication with an orchestration controller such as the orchestration controller 106/206/306/406 illustrated in FIGS. 1-3 and 4A-4C, respectively. In some embodiments, the system event queue 530, the event queue 532, and the message buffer 534 can be in direct communication with the orchestration controller, or the system event queue 530, the event queue 532, and the message buffer 534 can be in communication with a network on a chip such as the NoC 108/208/308 illustrated in FIGS. 1-3, respectively, which can further be in communication with the orchestration controller.

The system event queue 530, the event queue 532, and the message buffer 534 can receive messages and/or commands from the orchestration controller and/or can send messages and/or commands to the orchestration controller to control operation of the computing tile 510 to perform operations on bit strings (e.g., the bit strings 211 and 311 illustrated in FIGS. 2 and 3, herein) that are processed by the computing tile 510. In some embodiments, the commands and/or messages can include messages and/or commands to allocate or de-allocate resources available to the computing tile 510 during performance of the operations. In addition, the commands and/or messages can include commands and/or messages to synchronize operation of the computing tile 510 with other computing tiles deployed in a storage controller (e.g., the storage controller 104/204/304/404 illustrated in FIG. 1-4, respectively).

For example, the system event queue 530, the event queue 532, and the message buffer 534 can facilitate communication between the computing tile 510 and the orchestration controller to cause the computing tile 510 to to convert bit strings between various formats, as well as operations to perform arithmetic and/or logical operations using the bit strings. In addition, the system event queue 530, the event queue 532, and the message buffer 534 can facilitate communication between the computing tile 510 and the orchestration controller to cause the computing tile 510 to reduce a size and/or quantity of data associated with the bit strings or blocks of data that include the bit strings. In a non-limiting example, the system event queue 530, the event queue 532, and the message buffer 534 can process commands and/or messages received from the orchestration controller to cause the computing tile 510 to perform an operation on a bit string in which the bit string is converted from a first format (e.g., a floating-point format) to a second format (e.g., a universal number or posit format). In some embodiments, the system event queue 530, the event queue 532, and the message buffer 534 can process commands and/or messages received from the orchestration controller to cause the computing tile 510 to perform an arithmetic and/or logical operation on a converted bit string.

The system event queue 530 can receive interrupt messages from the orchestration controller or NoC. The interrupt messages can be processed by the system event queue 532 to cause a command or message sent from the orchestration controller or the NoC to be immediately executed. For example, the interrupt message(s) can instruct the system event queue 532 to cause the computing tile 510 to abort operation of pending commands or messages and instead execute a new command or message received from the orchestration controller or the NoC. In some embodiments, the new command or message can involve a command or message to initiate an operation to process, using the computing tile 510, one or more bit strings to convert the bit strings between various formats and/or an operation to process the bit strings by performing an arithmetic and/or logical operation using the converted bit strings.

The event queue 532 can receive messages that can be processed serially. For example, the event queue 532 can receive messages and/or commands from the orchestration controller or the NoC and can process the messages received in a serial manner such that the messages are processed in the order in which they are received. Non-limiting examples of messages that can be received and processed by the event queue can include request messages from the orchestration controller and/or the NoC to initiate performance of an operation using a bit string (e.g., a remote procedure call on the computing tile 510), request messages from other computing tiles to provide or alter the contents of a particular memory location in the computing tile memory 538 of the computing tile that receives the message request (e.g., messages to initiate remote read or write operations amongst the computing tiles), synchronization message requests from other computing tiles to synchronize processing of blocks of data among the computing tiles, etc.

The message buffer 534 can comprise a buffer region to buffer data to be transferred out of the computing tile 510 to circuitry external to the computing tile 510 such as the orchestration controller, the NoC, and/or the host. In some embodiments, the message buffer 534 can operate in a serial fashion such that data is transferred from the buffer out of the computing tile 510 in the order in which it is received by the message buffer 534. The message buffer 534 can further provide routing control and/or bottleneck control by controlling a rate at which the data is transferred out of the message buffer 534. For example, the message buffer 534 can be configured to transfer data out of the computing tile 510 at a rate that allows the data to be transferred out of the computing tile 510 without creating data bottlenecks or routing issues for the orchestration controller, the NoC, and/or the host, which are shown in FIGS. 1-3 and 4A-4C, herein.

The processing unit 536 can be in communication with the system event queue 530, the event queue 532, and the message buffer 534 and can handle the commands and/or messages received by the system event queue 530, the event queue 532, and the message buffer 534 to facilitate performance of operations on the bit strings received by the computing tile 510. For example, the processing unit 536 can include circuitry configured to process commands and/or messages to convert the bit strings between various formats, perform arithmetic operations using the bit strings, and/or perform logical operations using the bit strings received by the computing tile 510. The processing unit 536 may include a single core or may be a multi-core processor.

The computing tile memory 538 can, in some embodiments, be a memory resource such as random-access memory (e.g., RAM, SRAM, etc.). Embodiments are not so limited, however, and the computing tile memory 538 can include various registers, caches, buffers, and/or memory arrays (e.g., 1T1C, 2T2C, 3T, etc. DRAM arrays). For example, the computing tile memory 538 can include volatile memory resource, non-volatile memory resources, or a combination of volatile and non-volatile memory resources. In some embodiments, the computing tile memory 538 can be a cache, one or more registers, NVRAM, ReRAM, FeRAM, MRAM, PCM), "emerging" memory devices such as 3-D Crosspoint (3D XP) memory devices, etc., or combinations thereof.

The computing tile memory 538 can be configured to receive bit strings from, for example, a memory device such as the memory devices 116-1, . . . , 116-N illustrated in FIG. 1, herein. The bit strings can, in some embodiments, be included in a block of data. In some embodiments, the computing tile memory 538 can have a size of approximately 256 kilobytes (KB), however, embodiments are not limited to this particular size, and the computing tile memory 538 can have a size greater than, or less than, 256 KB.

The computing tile memory 538 can be partitioned into one or more addressable memory regions. As shown in FIG. 5, the computing tile memory 538 can be partitioned into addressable memory regions so that various types of data can be stored therein. For example, one or more memory regions can store instructions ("INSTR") 541 used by the computing tile memory 538, one or more memory regions can store a bit string 543-1, . . . , 543-N (e.g., a bit string retrieved from the memory device(s)), and/or one or more memory regions can serve as a local memory ("LOCAL MEM.") 545 portion of the computing tile memory 538. Although twenty (20) distinct memory regions are shown in FIG. 5, it will be appreciated that the computing tile memory 538 can be partitioned into any number of distinct memory regions.

As discussed above, the bit strings can be retrieved from the memory device(s) in response to messages and/or commands generated by the orchestration controller (e.g., the orchestration controller 106/206/306/406 illustrated in FIGS. 1-4, herein). In some embodiments, the commands and/or messages can be processed by a media controller such as the media controller 112/212/312/412 illustrated in FIGS. 1-4, respectively. Once the bit strings are received by the computing tile 510, they can be buffered by the DMA buffer 539 and subsequently stored in the computing tile memory 538. Embodiments are not so limited, however, and in some embodiments, the bit strings can be retrieved from a host (e.g., the host 102 illustrated in FIG. 1) in response to messages and/or commands generated by the orchestration controller As a result, in some embodiments, the computing tile 510 can provide data driven performance of operations on bit strings or data received from the memory device(s). For example, the computing tile 510 can begin performing operations on bit strings (e.g., operations to convert the bit strings between various formats, arithmetic operations using the bit strings, logical operations using the bit strings, etc.) received from the memory device(s) in response to receipt of the bit strings or data.

For example, because of the non-deterministic nature of data transfer from the memory device(s) to the computing tile 510 (e.g., because some bit strings or blocks of data may take longer to arrive at the computing tile 510 dude to error correction operations performed by a media controller prior to transfer of the bit strings or blocks of data to the computing tile 510, etc.), data driven performance of the operations on bit strings or blocks of data can improve computing performance in comparison to approaches that do not function in a data driven manner.

In some embodiments, the orchestration controller can send a command or message that is received by the system event queue 530 of the computing tile 510. As described above, the command or message can be an interrupt that instructs the computing tile 510 to request a bit string and perform an operation on the bit string to convert the bit string between various formats, perform arithmetic and/or logical operations on the bit string, and/or operations to convert a resultant bit string between various formats, etc. However, the bit string or block of data may not immediately be ready to be sent from the memory device to the computing tile 510 due to the non-deterministic nature of data transfers from the memory device(s) to the computing tile 510. However, once the bit string or block of data is received by the computing tile 510, the computing tile 510 can immediately begin performing the operation to convert the bit string between various formats, perform arithmetic and/or logical operations on the bit string, and/or operations to convert a resultant bit string between various formats, etc. Stated alternatively, the computing tile 510 can begin performing operations on the bit strings or blocks of data responsive to receipt of the block of data without requiring an additional command or message to cause performance of the operation on the block of data.

In some embodiments, the operation can be performed by selectively moving data around in the computing tile memory 538 to convert the bit string between various formats, perform arithmetic and/or logical operations on the bit string, and/or operations to convert a resultant bit string between various formats, etc. Embodiments are not so limited, however, and in some embodiments, the processing unit 536 can receive the bit strings from the computing tile memory 538 and perform operations to convert the bit string between various formats, perform arithmetic and/or logical operations on the bit string, and/or operations to convert a resultant bit string between various formats, etc. Subsequent to performance of the operations on the bit strings, the processing unit 536 can execute instructions to transfer a resultant bit string to a different partition of the computing tile memory (e.g., to block 543-N). At this stage, the resultant bit string (e.g., the bit string stored in block 543-N can be transferred to the message buffer 534 to be transferred to circuitry external to the computing tile 510.

As the resultant bit string is transferred to the message buffer 534, a subsequent bit string or block of data can be transferred from the DMA buffer 539 to the computing tile memory 538 and an operation to convert the bit string between various formats, perform arithmetic and/or logical operations on the bit string, and/or operations to convert a resultant bit string between various formats, etc. can be initiated in the computing tile memory 538. By having a subsequent bit string or block of data buffered into the computing tile 510 prior to completion of the operation on the preceding bit string or block of data, bit strings and/or blocks of data can be continuously streamed through the computing tile in the absence of additional commands or messages from the orchestration controller to initiate operations on subsequent blocks of data. In addition, by preemptively buffering subsequent blocks of data into the DMA buffer 539, delays due to the non-deterministic nature of data transfer from the memory device(s) to the computing tile 510 can be mitigated as the bit strings and/or blocks of data are operated on while being streamed through the computing tile 510.

In another non-limiting example, a block of data that includes multiple bit strings can be received by the computing tile 510. If particular bit strings or particular data are desired from the block of data, the block of data can be stored in a particular partition (e.g., block 543-1) of the computing tile memory 538. The processing unit 536 can execute instructions to cause the particular bit strings or particular data (e.g., the requested or relevant data) to be moved to a different partition (e.g., block 543-N) of the computing tile memory 538. At this stage, the resultant bit string stored in block 543-N can be transferred to the message buffer 534 to be transferred to circuitry external to the computing tile 510.

As the resultant bit string is transferred to the message buffer 534, a subsequent bit string or block of data can be transferred from the DMA buffer 539 to the computing tile memory 538 and an operation to convert the bit string between various formats, perform arithmetic and/or logical operations on the bit string, and/or operations to convert a resultant bit string between various formats, etc. can be initiated in the computing tile memory 538. Although described above in the context of a resultant bit string, embodiments are not so limited, and the computing tile 510 can perform other operations, such as operations in which at least some of the data is ordered, reordered, removed, or discarded, arithmetic operations, and/or logical operations on the block(s) of data in a similar manner.

When the resultant bit string(s) is to be moved out of the computing tile 510 to circuitry external to the computing tile 510 (e.g., to the NoC, the orchestration controller, and/or the host), the processing unit 536 can send a command and/or a message to the orchestration controller, which can, in turn send a command and/or a message to request the resultant bit string from the computing tile memory 538.

Responsive to the command and/or message to request the resultant bit string, the computing tile memory 538 can transfer the resultant bit string to a desired location (e.g., to the NoC, the orchestration tile, and/or the host illustrated in FIGS. 1-3 and 4A-4C, herein). For example, responsive to a command to request the resultant bit string, the resultant bit string can be transferred to the message buffer 534 and subsequently transferred out of the computing tile 510. In some embodiments, the data transferred from the computing tile memory 538 to the NoC, the orchestration controller, and/or the host can be a bit string that has had an operation performed thereon to convert the bit string between various formats, perform arithmetic and/or logical operations on the bit string, and/or operations to convert a resultant bit string between various formats, etc.

In some embodiments, a computing device (e.g., the computing tile 510) can include a processing unit 536 and a memory resource (e.g., the computing tile memory resource 538) configured as a cache for the processing unit. The computing device can be configured to receive a command to initiate an operation to convert data comprising a bit string having a first format that supports arithmetic operations to a first level of precision to a bit string having a second format that supports arithmetic operations to a second level of precision, receive, by the memory resource, the bit string responsive to receipt of the command, and/or responsive to receipt of the data, perform the operation on the bit string to convert the data from the first format to the second format.

At least one of the first format and the second format comprises a floating-point format and the other of the first format and the second format comprises a universal number format. For example, at least one of the first format and the second format can comprise an IEEE 754 format and the other of the first format and the second format can comprise a Type III universal number format or a posit format.

In some embodiments, the computing device can be configured to perform the operation on the bit string to convert the bit string to the second format responsive to receipt of the bit string in the absence of an intervening command, as described above. The computing device can be further configured to receive an interrupt message as part of the command to initiate the operation.

As described above, the processing unit 536 of the computing device can be configured to perform an arithmetic operation or a logical operation, or both, using the bit string having the second format. In some embodiments, the computing device can be configured to cause a bit string representing a result of the arithmetic operation or the logical operation, or both, to be transferred to circuitry external to the computing device in the absence of receipt of an intervening command by the computing device.

As shown in FIG. 5, the computing device can include a buffer 539 to receive subsequent data comprising a different bit string during performance of the operation on the bit string. The computing device may be configured to perform a subsequent operation on the subsequent data to convert the subsequent bit string from the first format to the second format in the absence of receipt of an intervening command to initiate the subsequent operation.

In some embodiments, the computing tile 510 may perform the above-listed operations in conjunction with execution of one or more machine learning algorithms. For example, the computing tile 510 may perform operations related to one or more neural networks. Neural networks may allow for an algorithm to be trained over time to determine an output response based on input signals. For example, over time, a neural network may essentially learn to better maximize the chance of completing a particular goal. This may be advantageous in machine learning applications because the neural network may be trained over time with new data to achieve better maximization of the chance of completing the particular goal. A neural network may be trained over time to improve operation of particular tasks and/or particular goals. However, in some approaches, machine learning (e.g., neural network training) may be processing intensive (e.g., may consume large amounts of computer processing resources) and/or may be time intensive (e.g., may require lengthy calculations that consume multiple cycles to be performed). In contrast, by performing such operations using computing tile 510, for example, by performing such operations on bit strings in the posit format, the amount of processing resources and/or the amount of time consumed in performing the operations may be reduced in comparison to approaches in which such operations are performed using bit strings in a floating-point format In a non-limiting neural network training application, the computing tile 510 can receive a floating-point bit string that has been converted by the conversion component into an 8-bit posit with an exponent bit portion (or "bit sub-set") that is equal to zero (e.g., es=0, as described in more detail in connection with FIGS. 7 and 8A-8B). In contrast to some approaches that utilize a half-precision 16-bit floating-point bit string for neural network training, an 8-bit posit bit string with es=0 can provide comparable neural network training results two to four times faster than the half-precision 16-bit floating-point bit string.

A common function used in training neural networks is a sigmoid function $f(x)$ (e.g., a function that asymptotically approaches zero as $x \rightarrow -\infty$ and asymptotically approaches 1 as $x \rightarrow \infty$). An example of a sigmoid function that may be used in neural network training applications is $$\frac{1}{1+e^{-x}},$$

which can require upwards of one-hundred clock cycles to compute using half-precision 16-bit floating-point bit strings. However, using an 8-bit posit with es=0, the same function can be evaluated by the computing tile 510 by flipping the first bit of the posit representing x and shifting two bits to the right—operations that may take at least an order of magnitude fewer clock signals in comparison to evaluation of the same function using a half-precision 16-bit floating-point bit string.

In this example, by receiving a bit string that has been converted by the conversion component into an 8-bit posit bit string with es=0 and then subsequently operating the computing tile 510 to perform the operation to evaluate the example sigmoid function on the 8-bit posit bit string, processing time, resource consumption, and/or storage space can be reduced in comparison to approaches that do not include a computing tile 510 configured to perform such operations. This reduction in processing time, resource consumption, and/or storage space can improve the function of a computing system in which the computing tile 510 is operating by reducing the number of clock signals used in performing such operations, which may reduce an amount of power consumed by the computing device and/or an amount of time to perform such operations, as well as by freeing up processing and/or memory resources for other tasks and functions.

FIG. 6 is another block diagram in the form of a computing tile 610 in accordance with a number of embodiments of the present disclosure. As shown in FIG. 6, the computing tile 610 can include a system event queue 630, an event queue 632, and a message buffer 634. The computing tile 610 can further include an instruction cache 635, a data cache 637, a processing unit 636 or "processing device" such as a reduced instruction set computing (RISC) device, a computing tile memory 638 portion, and a direct memory access buffer 639. The computing tile 610 shown in FIG. 6 can be analogous to the computing tile 510 illustrated in FIG. 5, however, the computing tile 610 illustrated in FIG. 6 further includes the instruction cache 635 and/or the data cache 637.

The instruction cache 635 and/or the data cache 637 can be smaller in size than the computing tile memory 638. For example, the computing tile memory can be approximately 256 KB while the instruction cache 635 and/or the data cache 637 can be approximately 32 KB in size. Embodiments are not limited to these particular sizes, however, so long as the instruction cache 635 and/or the data cache 637 are smaller in size than the computing tile memory 638.

In some embodiments, the instruction cache 635 can store and/or buffer messages and/or commands transferred between the processing unit 636 to the computing tile memory 638, while the data cache 637 can store and/or buffer data transferred between the computing tile memory 638 and the processing unit 636.

As shown in FIG. 6, the computing tile memory resource 638 can be coupled to inbound buffering circuitry (e.g., the DMA buffer 639). The processing unit 636 can be coupled to the computing tile memory resource 638, queuing circuitry (e.g., the system event queue 630, the event queue 632, etc.) and outbound buffering circuitry (e.g., the message buffer 634). In some embodiments, the processing unit 636 can be configured to receive, via the queuing circuitry, a command to initiate an operation (e.g., an interrupt message) to convert data comprising a bit string having a first format that supports arithmetic operations to a first level of precision to a bit string having a second format that supports arithmetic operations to a second level of precision. As described above, in some embodiments, at least one of the first format and the second format can be an IEEE 754 format and the other of the first format and the second format can be a universal number format.

The processing unit 636 can further be configured to cause a first bit string to be loaded into the computing tile memory resource 638 from the inbound buffering circuitry, cause the computing tile memory resource 638 to perform the operation on the first bit string, cause a second bit string to be loaded into the inbound buffering circuitry, cause the second bit string to be loaded into the computing tile memory resource 638 from the inbound buffering circuitry, and responsive to a determination that the operation on the first bit string is complete, cause the computing tile memory resource 638 to perform the operation on the second bit string.

In some embodiments, the processing unit 636 can be configured to cause the second bit string to be loaded into the inbound buffering circuitry, loaded into the computing tile memory resource 638, and cause the computing tile memory resource 638 to perform the operation on the second bit string in the absence of an additional command separate from the command to initiate the operation.

As described above, in some embodiments, the processing unit 636 can be configured to perform an arithmetic operation or a logical operation, or both, using the bit string having the second format. Subsequent to performance of the arithmetic and/or logical operation, the processing unit 636 can be configured to cause a bit string representing a result of the arithmetic operation and/or the logical operation (e.g., a resultant bit string) to be transferred to the outbound buffering circuitry and transferred to circuitry external to a computing device (e.g., the computing tile 610) in which the processing unit 636 is deployed in the absence of receipt of an intervening command.

Figure 7:
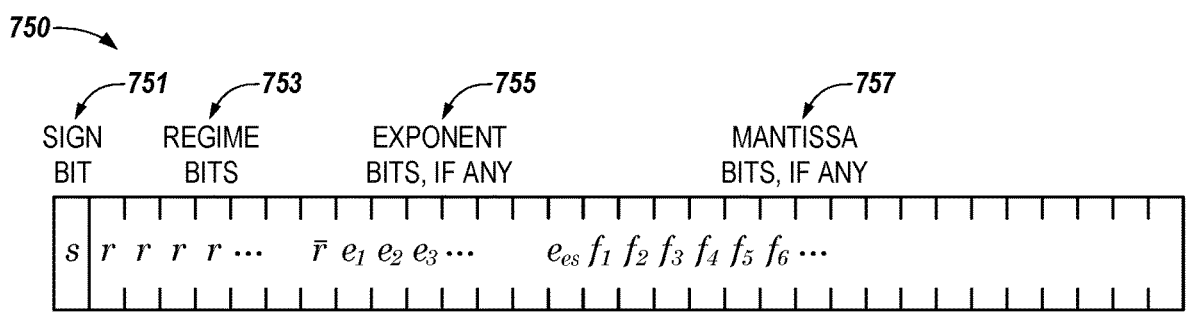
FIG. 7 is an example of an n-bit post with es exponent bits.

FIG. 7 is an example of an n-bit universal number, or "unum" with es exponent bits. In the example of FIG. 7, the n-bit unum is a posit bit string 750. As shown in FIG. 7, the n-bit posit 750 can include a set of sign bit(s) (e.g., a sign bit 751), a set of regime bits (e.g., the regime bits 753), a set of exponent bits (e.g., the exponent bits 755), and a set of mantissa bits (e.g., the mantissa bits 757). The mantissa bits 757 can be referred to in the alternative as a "fraction portion" or as "fraction bits," and can represent a portion of a bit string (e.g., a number) that follows a decimal point.

The sign bit 751 can be zero (0) for positive numbers and one (1) for negative numbers. The regime bits 753 are described in connection with Table 1, below, which shows (binary) bit strings and their related numerical meaning, k. In Table 1, the numerical meaning, k, is determined by the run length of the bit string. The letter x in the binary portion of Table 1 indicates that the bit value is irrelevant for determination of the regime, because the (binary) bit string is terminated in response to successive bit flips or when the end of the bit string is reached. For example, in the (binary) bit string 0010, the bit string terminates in response to a zero flipping to a one and then back to a zero. Accordingly, the last zero is irrelevant with respect to the regime and all that is considered for the regime are the leading identical bits and the first opposite bit that terminates the bit string (if the bit string includes such bits).

TABLE 1

| | Binary | | | | | | | |
|---|---|---|---|---|---|---|---|---|
| | 0000 | 0001 | 001X | 01XX | 10XX | 110X | 1110 | 1111 |
| Numerical (k) | −4 | −3 | −2 | −1 | 0 | 1 | 2 | 3 |

In FIG. 3, the regime bits 753 r correspond to identical bits in the bit string, while the regime bits 753 r̄ correspond to an opposite bit that terminates the bit string. For example, for the numerical k value −2 shown in Table 1, the regime bits r correspond to the first two leading zeros, while the regime bit(s) r̄ correspond to the one. As noted above, the final bit corresponding to the numerical k, which is represented by the X in Table 1 is irrelevant to the regime.

If m corresponds to the number of identical bits in the bit string, if the bits are zero, k=−m. If the bits are one, then k=m−1. This is illustrated in Table 1 where, for example, the (binary) bit string 10XX has a single one and k=m−1=1−1=0. Similarly, the (binary) bit string 0001 includes three zeros so k=−m=−3. The regime can indicate a scale factor of useed$^k$, where useed=$2^{2^{es}}$. Several example values for used are shown below in Table 2.

TABLE 2

| | es | | | | |
|---|---|---|---|---|---|
| | 0 | 1 | 2 | 3 | 4 |
| used | 2 | $2^2 = 4$ | $4^2 = 16$ | $16^2 = 256$ | $256^2 = 65536$ |

The exponent bits 755 correspond to an exponent e, as an unsigned number. In contrast to floating-point numbers, the exponent bits 755 described herein may not have a bias associated therewith. As a result, the exponent bits 755 described herein may represent a scaling by a factor of $2^e$. As shown in FIG. 7, there can be up to es exponent bits ($e_1$, $e_2$, $e_3$, ..., $e_{es}$), depending on how many bits remain to right of the regime bits 753 of the n-bit posit 750. In some embodiments, this can allow for tapered accuracy of the n-bit posit 750 in which numbers which are nearer in magnitude to one have a higher accuracy than numbers which are very large or very small. However, as very large or very small numbers may be utilized less frequent in certain kinds of operations, the tapered accuracy behavior of the n-bit posit 750 shown in FIG. 7 may be desirable in a wide range of situations.

The mantissa bits 757 (or fraction bits) represent any additional bits that may be part of the n-bit posit 750 that lie to the right of the exponent bits 755. Similar to floating-point bit strings, the mantissa bits 757 represent a fraction $f$, which can be analogous to the fraction 1.$f$, where $f$ includes one or more bits to the right of the decimal point following the one. In contrast to floating-point bit strings, however, in the n-bit posit 750 shown in FIG. 7, the "hidden bit" (e.g., the one) may always be one (e.g., unity), whereas floating-point bit strings may include a subnormal number with a "hidden bit" of zero (e.g., 0.$f$).

Figure 8A:
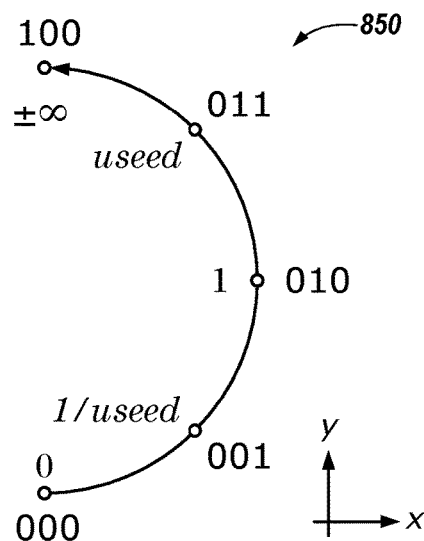
FIG. 8A is an example of positive values for a 3-bit posit.

FIG. 8A is an example of positive values for a 3-bit posit 850. In FIG. 8A, only the right half of projective real numbers, however, it will be appreciated that negative projective real numbers that correspond to their positive counterparts shown in FIG. 8A can exist on a curve representing a transformation about the y-axis of the curves shown in FIG. 8A.

Figure 8B:
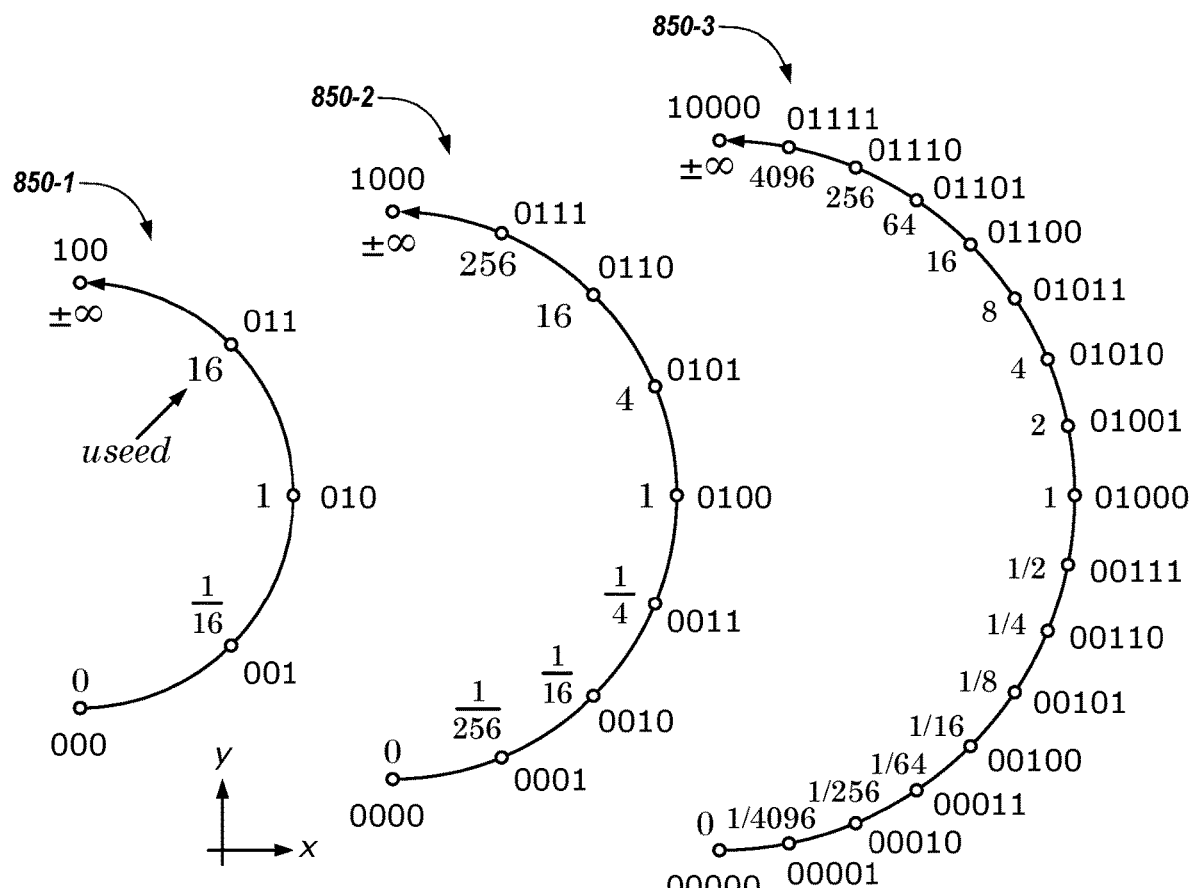
FIG. 8B is an example of posit construction using two exponent bits.

In the example of FIG. 8A, es=2, so useed=$2^{2^{es}}$=16. The precision of a posit 850 can be increased by appending bits the bit string, as shown in FIG. 8B. For example, appending a bit with a value of one (1) to bit strings of the posit 850-1 increases the accuracy of the posit 850 as shown by the posit 850-2 in FIG. 8B. Similarly, appending a bit with a value of one to bit strings of the posit 850-2 in FIG. 8B increases the accuracy of the posit 850-2 as shown by the posit 850-3 shown in FIG. 8B. An example of interpolation rules that may be used to append bits to the bits strings of the posits 850-1 shown in FIG. 8A to obtain the posits 850-2, 850-3 illustrated in FIG. 8B follow.

If maxpos is the largest positive value of a bit string of the posits 850-1, 850-2, 850-3 shown in FIG. 8B, and minpos is the smallest value of a bit string of the posits 850-1, 850-2, 850-3, maxpos may be equivalent to useed and minpos may be equivalent to $$\frac{1}{useed}.$$

Between maxpos ana ±∞, a new bit value may be maxpos*useed, and between zero and minpos, a new bit value may be $$\frac{minpos}{useed}.$$

These new bit values can correspond to a new regime bit 753. Between existing values x=2$^m$ and y=2$^n$, where m and n differ by more than one, the new bit value may be given by the geometric mean:

$$\sqrt{x \times y} = 2^{\frac{(m+n)}{2}},$$

which corresponds to a new exponent bit 755. If the new bit value is midway between the existing x and y values next to it, the new bit value can represent the arithmetic mean $$\frac{x+y}{2},$$

which corresponds to a new mantissa bit 757.

FIG. 8B is an example of posit construction using two exponent bits. In FIG. 8B, only the right half of projective real numbers, however, it will be appreciated that negative projective real numbers that correspond to their positive counterparts shown in FIG. 8B can exist on a curve representing a transformation about they-axis of the curves shown in FIG. 8B. The posits 850-1, 850-2, 850-3 shown in FIG. 8B each include only two exception values: Zero (0) when all the bits of the bit string are zero and ±∞ when the bit string is a one (1) followed by all zeros. It is noted that the numerical values of the posits 850-1, 850-2, 850-3 shown in FIG. 8B are exactly useed$^k$. That is, the numerical values of the posits 850-1, 850-2, 850-3 shown in FIG. 8B are exactly useed to the power of the k value represented by the regime (e.g., the regime bits 753 described above in connection with FIG. 7). In FIG. 8B, the posit 850-1 has es=2, so useed=$2^{2^{es}}$=16, the posit 850-2 has es=3, so useed=$2^{2^{es}}$=256, and the posit 850-3 has es=4, so useed=$2^{2^{es}}$=4096.

As an illustrative example of adding bits to the 3-bit posit 850-1 to create the 4-bit posit 850-2 of FIG. 8B, the useed=256, so the bit string corresponding to the useed of 256 has an additional regime bit appended thereto and the former useed, 16, has a terminating regime bit (r̄) appended thereto. As described above, between existing values, the corresponding bit strings have an additional exponent bit appended thereto. For example, the numerical values 1/16, 1/4, 1, and 4 will have an exponent bit appended thereto. That is, the final one corresponding to the numerical value 4 is an exponent bit, the final zero corresponding to the numerical value 1 is an exponent bit, etc. This pattern can be further seen in the posit 850-3, which is a 5-bit posit generated according to the rules above from the 4-bit posit 850-2. If another bit was added to the posit 850-3 in FIG. 4B to generate a 6-bit posit, mantissa bits 757 would be appended to the numerical values between 1/16 and 16.

A non-limiting example of decoding a posit (e.g., a posit 850) to obtain its numerical equivalent follows. In some embodiments, the bit string corresponding to a posit p is an unsigned integer ranging from $-2^{n-1}$ to $2^{n-1}$, k is an integer corresponding to the regime bits 335 and e is an unsigned integer corresponding to the exponent bits 755. If the set of mantissa bits 757 is represented as {$f_1 f_2 \ldots f_{fs}$} and f is a value represented by 1.$f_1 f_2 \ldots f_{fs}$ (e.g., by a one followed by a decimal point followed by the mantissa bits 757), the p can be given by Equation 1, below.

$$x = \begin{cases} 0, & p = 0 \\ \pm\infty, & p = -2^{n-1} \\ \text{sign}(p) \times useed^k \times 2^e \times f, & \text{all other } p \end{cases}$$

Equation 1

A further illustrative example of decoding a posit bit string is provided below in connection with the posit bit string 0000110111011101 shown in Table 3, below follows.

TABLE 3

| SIGN | REGIME | EXPONENT | MANTISSA |
|---|---|---|---|
| 0 | 0001 | 101 | 11011101 |

In Table 3, the posit bit string 0000110111011101 is broken up into its constituent sets of bits (e.g., the sign bit 751, the regime bits 753, the exponent bits 755, and the mantissa bits 757). Since es=3 in the posit bit string shown in Table 3 (e.g., because there are three exponent bits), useed=256. Because the sign bit 751 is zero, the value of the numerical expression corresponding to the posit bit string shown in Table 3 is positive. The regime bits 753 have a run of three consecutive zeros corresponding to a value of −3 (as described above in connection with Table 1). As a result, the scale factor contributed by the regime bits 753 is 256$^{-3}$ (e.g., useed$^k$). The exponent bits 755 represent five (5) as an unsigned integer and therefore contribute an additional scale factor of 2$^e$=2$^5$=32. Lastly, the mantissa bits 757, which are given in Table 3 as 11011101, represent two-hundred and twenty-one (221) as an unsigned integer, so the mantissa bits 757, given above as f are $$f + \frac{221}{256}.$$

Using these values and Equation 1, the numerial value corresponding to the posit bit string given in Table 3 is $$+256^{-3} \times 2^5 \times \left(1 + \frac{221}{256}\right) = \frac{437}{134217728} \approx 3.55393 \times 10^{-6}.$$

Figure 9:
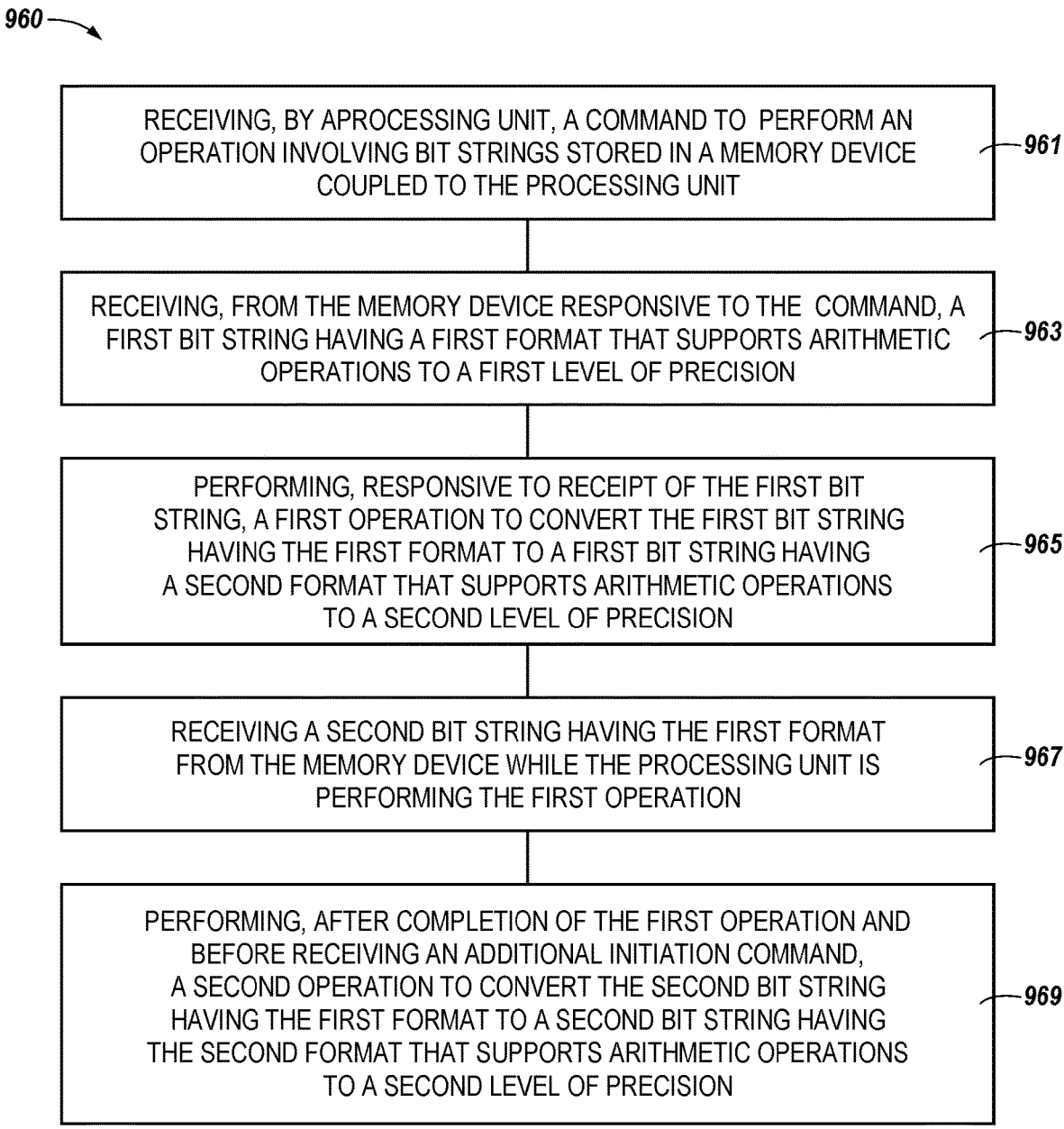
FIG. 9 is a flow diagram representing an example method for bit string operations using a computing tile in accordance with a number of embodiments of the present disclosure.

FIG. 9 is a flow diagram representing an example method 960 for bit string operations using a computing tile in accordance with a number of embodiments of the present disclosure. At block 961, the method 960 can include receiving, by a processing unit, a command to perform an operation involving bit strings stored in a memory device coupled to the processing unit. The processing unit can be analogous to the processing unit 536/636 illustrated in FIGS. 5 and 6, herein, and the memory device can be analogous to the memory devices 116 illustrated in FIG. 1, herein.

At block 963, the method 960 can include receiving, responsive to the initiation command, a first bit string having a first format that supports arithmetic operations to a first level of precision from the memory device. The first bit string can be an IEEE 754 formatted bit string, such as a floating-point bit string.

At block 965, the method 960 can include performing, responsive to receipt of the first bit string, a first operation to convert the first bit string having the first format to a first bit string having a second format that supports arithmetic operations to a second level of precision. In some embodiments, the first format can include a mantissa, a base, and an exponent, and the second format can include a mantissa, a regime, a sign, and an exponent. As described above, the first format can be a floating-point format and the second format can be a posit format.

At block 967, the method 960 can include receiving a second bit string having the first format from the memory device while the processing unit is performing the first operation. In some embodiments, the second bit string can be buffered by circuitry coupled to the processing unit, as described above in connection with FIGS. 5 and 6.

At block 969, the method 960 can include performing, after completion of the first operation and before receiving an additional initiation command, a second operation to convert the second bit string having the first format to a second bit string having the second format that supports arithmetic operations to a second level of precision. That is, the method 960 can, in some embodiments, include performing the second operation in the absence of receipt of a host command from a host coupleable to the plurality of computing devices. In some embodiments, the method 960 can further include performing the first operation and the second operation includes performing the first operation and the second operation within a memory resource (e.g., the computing tile memory resource 538/638 illustrated in FIGS. 5 and 6, herein) coupled to the processing unit.

In some embodiments, the method 960 can include buffering, by buffer circuitry coupled to the processing unit, the second bit string prior to performance of the second operation such that the second bit string is available to processing unit to perform the second operation upon completion of the first operation. The method 960 can further include generating a logical record corresponding to a result of the arithmetic operation or the logical operation, or both.

The method 960 can further include performing an arithmetic operation or a logical operation, or both, using the first bit string having the second format and the second bit string having the second format. The operation can, in some embodiments, be a bit-wise operation, vector operation, or other arithmetic operation and/or a logical operation, as described in more detail above. In some embodiments, the operation can be an operation used as part of training a neural network. For example, the operation can be a convolution operation, a sigmoid function operation, etc. In some embodiments, the method 960 can include transferring a result of the arithmetic operation or the logical operation, or both, to circuitry external to the processing unit in response to completion of the operation the arithmetic operation or the logical operation, or both.

In some embodiments, the method 960 can include requesting, by the processing unit, information stored in an address space of a processing unit different than the processing unit and/or transferring the requested information from the processing unit different than the processing unit to the processing unit. For example, the method 960 can include sending a command to a different processing unit to cause performance of the operation (or a sub-operation) and/or performing, using the different processing unit, the operation or sub-operation as part of performance of the arithmetic operation, the logical operation, or both.

In some embodiments, the method 960 can further include determining that at least one sub-operation is to be performed as part of the arithmetic operation, the logical operation, or both. The method 960 can also include sending a command to a processing unit different than the particular computing device to cause performance of the sub-operation and/or performing, using the different processing unit, the sub-operation as part of performance of the arithmetic operation, the logical operation, or both. In some embodiments, the method 960 can include performing, by the processing unit, a subsequent operation to convert a bit string having the second format to a second bit string having the first format. For example, the method 960 can include receiving, a resultant bit string in a posit format and performing a second conversion operation using the processing unit to convert the result of the operation to a floating-point format.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a computing tile resident on a storage controller that is resident on a memory device, the computing tile comprising a processing unit a memory resource configured as a cache for the processing unit, and a direct media access (DMA) buffer, wherein the storage controller is configured to:
control access to a memory device couplable to the storage controller by latching address signals associated with storage of data within the memory device;
receive a command to initiate an operation to convert data comprising a bit string having a first format that supports arithmetic operations to a first level of precision to a bit string having a second format that supports arithmetic operations to a second level of precision;
receive, by the memory resource, the bit string based, at least in part, on receipt of the command; and
responsive to receipt of the data, perform the operation on the bit string to convert the data from the first format to the second format, and wherein:

the DMA buffer is to receive subsequent data comprising a different bit string during performance of the operation on the bit string, and the storage controller is configured to perform a subsequent operation on the subsequent data to convert the subsequent bit string from the first format to the second format in the absence of receipt of an intervening command to initiate the subsequent operation.

2. The apparatus of claim 1, wherein at least one of the first format or the second format comprises a floating-point format and the other of the first format and the second format comprises a universal number format.

3. The apparatus of claim 1, wherein at least one of the first format or the second format comprises an IEEE 754 format and the other of the first format and the second format comprises a Type III universal number format or a posit format.

4. The apparatus of claim 1, wherein the storage controller is configured to perform the operation on the bit string to convert the bit string to the second format responsive to receipt of the bit string in the absence of an intervening command.

5. The apparatus of claim 1, wherein the storage controller is further configured to receive an interrupt message as part of the command to initiate the operation.

6. The apparatus of claim 1, wherein the processing unit of the storage controller is configured to perform an arithmetic operation or a logical operation, or both, using the bit string having the second format.

7. The apparatus of claim 1, wherein the storage controller is configured to cause a bit string representing a result of the arithmetic operation or the logical operation, or both, to be transferred to circuitry external to the storage controller in the absence of receipt of an intervening command by the storage controller.

8. An apparatus, comprising:
a storage controller resident on a memory device and comprising:
address circuitry to control access to a memory device couplable to the storage controller by latching address signals associated with storage of data within the memory device;
a memory resource coupled to a direct media access (DMA) buffer; and
a processing unit coupled to the memory resource, a command queue, and an output buffer, wherein the processing unit is configured to:
receive, via the command queue, a command to initiate an operation to convert data comprising a bit string having a first format that supports arithmetic operations to a first level of precision to a bit string having a second format that supports arithmetic operations to a second level of precision;
cause a first bit string to be loaded into the memory resource from the DMA buffer;
cause the memory resource to perform the operation on the first bit string;
cause a second bit string to be loaded into the DMA buffer;
cause the second bit string to be loaded into the memory resource from the DMA buffer; and
responsive to a determination that the operation on the first bit string is complete, cause the memory resource to perform the operation on the second bit string.

9. The apparatus of claim 8, wherein at least one of the first format and the second format comprises an IEEE 754 format and the other of the first format and the second format comprises a universal number format.

10. The apparatus of claim 8, wherein the processing unit is further configured to cause the second bit string to be loaded into the input buffer, loaded into the memory resource, and cause the memory resource to perform the operation on the second bit string in the absence of an additional command separate from the command to initiate the operation.

11. The apparatus of claim 8, wherein the processing unit is configured to perform an arithmetic operation or a logical operation, or both, using the bit string having the second format.

12. The apparatus of claim 11, wherein the processing unit is configured to cause, subsequent to performance of the arithmetic operation or the logical operation, or both a bit string representing a result of the arithmetic operation or the logical operation, or both, to be:
transferred to the output buffer; and
transferred to circuitry external to the storage controller in which the processing unit is deployed in the absence of receipt of an intervening command.

13. The apparatus of claim 8, wherein the command to initiate the operation includes an interrupt message.

14. A method, comprising:
receiving, by a computing tile resident on a storage controller that is resident on a memory device, wherein the computing tile comprises a processing unit, a memory resource, and a direct media access (DMA) buffer, signaling to control access to a memory device couplable to the storage controller by latching address signals associated with storage of data within the memory device;
receiving, by the storage controller, a command to perform an operation involving bit strings stored in the memory resource of the computing tile;
receiving, from the memory device responsive to the command, a first bit string having a first format that supports arithmetic operations to a first level of precision;
performing, responsive to receipt of the first bit string, a first operation to convert the first bit string having the first format to a first bit string having a second format that supports arithmetic operations to a second level of precision;
receiving, by the DMA buffer of the computing tile, a second bit string having the first format from the memory device while the processing unit is performing the first operation;
performing, after completion of the first operation and before receiving an additional initiation command, a second operation to convert the second bit string having the first format to a second bit string having the second format that supports arithmetic operations to a second level of precision.

15. The method of claim 14, further comprising buffering, by buffer circuitry coupled to the processing unit, the second bit string prior to performance of the second operation such that the second bit string is available to the processing unit to perform the second operation upon completion of the first operation.

16. The method of claim 14, wherein performing the first operation and the second operation includes performing the first operation and the second operation within a memory resource coupled to the processing unit.

17. The method of claim 14, further comprising performing an arithmetic operation or a logical operation, or both, using the first bit string having the second format and the second bit string having the second format.

18. The method of claim 17, further comprising generating a logical record corresponding to a result of the arithmetic operation or the logical operation, or both.

19. The method of claim 17, further comprising transferring a result of the arithmetic operation or the logical operation, or both, to circuitry external to the processing unit in response to completion of the operation the arithmetic operation or the logical operation, or both.

20. The method of claim 14, further comprising:
requesting, by the processing unit, information stored in an address space of a processing unit different than the processing unit;
transferring the requested information from the processing unit different than the processing unit to the processing unit.

* * * * *